United States Patent
Murata et al.

(10) Patent No.: US 9,263,320 B2
(45) Date of Patent: Feb. 16, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Tatsunori Murata, Kanagawa (JP); Takahiro Maruyama, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/593,060

(22) Filed: Jan. 9, 2015

(65) Prior Publication Data
US 2015/0206787 A1 Jul. 23, 2015

(30) Foreign Application Priority Data
Jan. 21, 2014 (JP) ................................. 2014-009013

(51) Int. Cl.
*H01L 21/764* (2006.01)
*H01L 21/02* (2006.01)
*H01L 21/762* (2006.01)

(52) U.S. Cl.
CPC ........ *H01L 21/764* (2013.01); *H01L 21/02107* (2013.01); *H01L 21/02164* (2013.01); *H01L 21/02211* (2013.01); *H01L 21/02274* (2013.01); *H01L 21/76224* (2013.01)

(58) Field of Classification Search
CPC ...... H01L 21/764; H01L 21/762; H01L 21/02
USPC ......................................................... 438/422
See application file for complete search history.

(56) References Cited

U.S. PATENT DOCUMENTS

| 8,357,989 | B2 | 1/2013 | Onishi et al. | |
|---|---|---|---|---|
| 2005/0176215 | A1* | 8/2005 | Jeong | H01L 21/764 438/427 |
| 2006/0263991 | A1* | 11/2006 | Lee | H01L 21/76232 438/296 |
| 2008/0102579 | A1* | 5/2008 | Dong | H01L 27/11521 438/243 |
| 2008/0230847 | A1 | 9/2008 | Furusawa et al. | |
| 2010/0230741 | A1 | 9/2010 | Choi et al. | |
| 2011/0262642 | A1 | 10/2011 | Xiao et al. | |
| 2012/0049266 | A1* | 3/2012 | Oh | H01L 21/28273 257/316 |

FOREIGN PATENT DOCUMENTS

JP    2011-066067 A    3/2011

OTHER PUBLICATIONS

Extended European Search Report issued May 20, 2015, in European Patent Application No. EP15150071.7.

* cited by examiner

*Primary Examiner* — Asok K Sarkar
*Assistant Examiner* — Dmitriy Yemelyanov
(74) *Attorney, Agent, or Firm* — Shapiro, Gabor and Rosenberger, PLLC

(57) ABSTRACT

An object of the invention is to provide a semiconductor device having improved performance. A method of manufacturing a semiconductor device includes: forming a trench and then forming a first insulating film made of a silicon oxide film through CVD using a gas containing an $O_3$ gas and a TEOS gas to cover the side surface of the trench with the insulating film; forming a second insulating film made of a silicon oxide film through PECVD to cover the side surface of the trench with the second insulating film via the first insulating film; and forming a third insulating film made of a silicon oxide film through CVD using a gas containing an $O_3$ gas and a TEOS gas to close the trench with the third insulating film while leaving a space in the trench.

15 Claims, 25 Drawing Sheets

METHOD OF MANUFACTURING SEMICONDUCTOR DEVICE

CROSS-REFERENCE TO RELATED APPLICATIONS

The disclosure of Japanese Patent Application No. 2014-009013 filed on Jan. 21, 2014 including the specification, drawings, and abstract is incorporated herein by reference in its entirety.

BACKGROUND

The present invention relates to a method of manufacturing a semiconductor device. This method is suited for use, for example, in a method of manufacturing a semiconductor device having a trench portion.

There is a semiconductor device having an element isolation structure obtained by forming an insulating film in a trench portion formed in the surface, as a main surface, of a semiconductor substrate. There is another semiconductor device having an element isolation structure (deep trench isolation: DTI) obtained by forming an insulating film in a trench portion having an aspect ratio greater than 1. The term "aspect ratio" means a ratio of the depth of the trench portion to the width of the trench portion.

Japanese Unexamined Patent Application Publication No. 2011-66067 (Patent Document 1) discloses a method of manufacturing a semiconductor device including a step of forming, in the main surface of a semiconductor substrate, a trench that surrounds therewith an element in plan view and a step of forming an insulating film on the element and in the trench. In the technology described in Patent Document 1, the insulating film is formed so as to cover the upper portion of the element and at the same time forming a space in the trench.

Patent Document

[Patent Document 1] Japanese Unexamined Patent Application Publication No. 2011-66067

SUMMARY

When an insulating film is formed in a trench portion having a high aspect ratio as described above, for example, an insulating film made of a silicon oxide film is formed through chemical vapor deposition (CVD) and the trench portion is sometimes closed therewith while leaving a space in the trench portion. In this case, the thickness of the insulating film formed on the upper-portion side surface of the trench portion is likely to become greater than that of the insulating film formed on the bottom-portion side surface of the trench portion. By forming the insulating film on the side surface of the trench portion, therefore, the trench portion can be closed while leaving a space in the trench portion. Compared with a trench portion having therein no space, a trench portion having therein a space contributes to improvement in the element isolation characteristics upon isolating elements from each other by a DTI structure.

When an insulating film made of a silicon oxide film is formed through CVD, however, it is difficult to accurately adjust a closing position, which is an upper end position of a space to be left in the trench portion, to a desired height position. There is therefore a fear of the closing position of the space left in the trench portion becoming higher than the desired position.

When the closing position of the space becomes higher than the desired position, there is the possibility that upon forming an insulating film and then planarizing the insulating film, for example, by polishing the insulating film, the surface height position of the insulating film becomes lower than the closing position of the space and a polishing slurry penetrates through the space exposed from the surface of the insulating film or a washing liquid used in a later washing step penetrates through the space. The slurry or washing liquid penetrated through the space bursts therefrom and becomes a cause of foreign matters. The semiconductor device thus obtained may therefore have defects in its shape and have deteriorated performance.

Other objects and novel features will be apparent from the description herein and accompanying drawings.

In a method of manufacturing a semiconductor device according to one embodiment, after formation of a trench portion, a first insulating film made of a silicon oxide film is formed through chemical vapor deposition using a gas containing an ozone gas and a tetraethoxysilane gas to cover the side surface of the trench portion with the first insulating film. Then, a second insulating film made of a silicon oxide film is formed through plasma chemical vapor deposition to cover the side surface of the trench portion with the second insulating film via the first insulating film. Then, a third insulating film made of a silicon oxide film is formed by chemical vapor deposition using a gas containing an ozone gas and a tetraethoxysilane gas to close the trench portion with the third insulating film while leaving a space in the trench portion.

According to the above-mentioned one embodiment a semiconductor device having improved performance can be provided.

DETAILED DESCRIPTION

Figure 1:
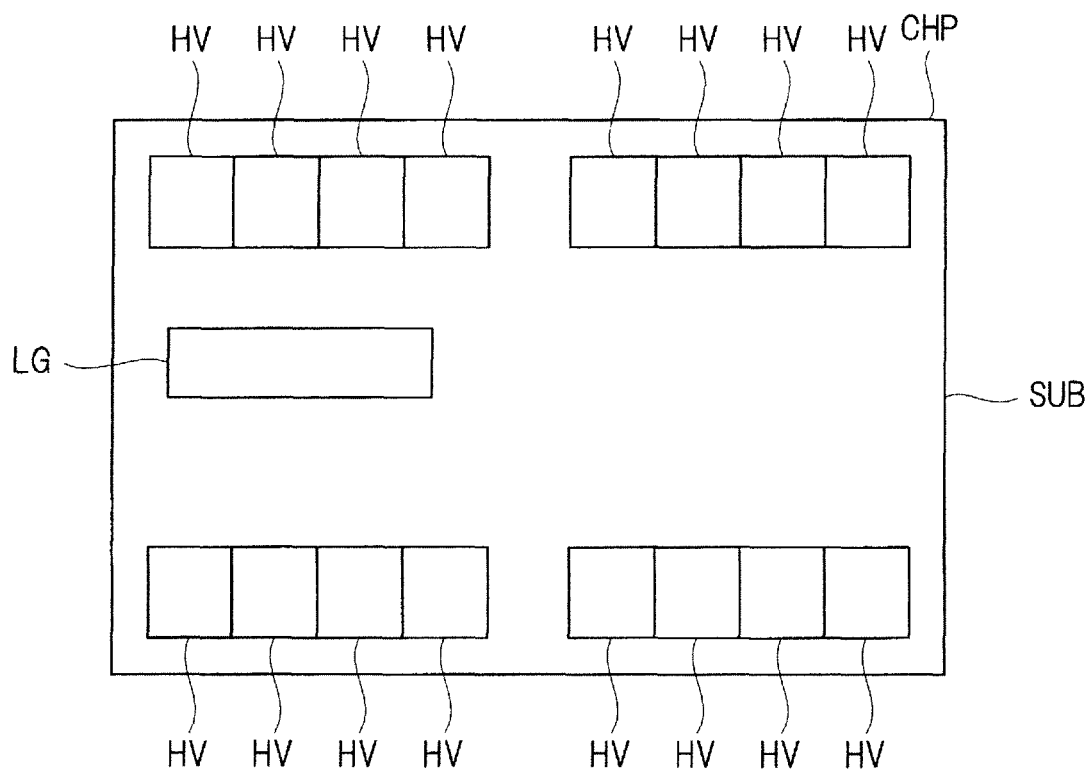
FIG. 1 is a plan view showing the configuration of a semiconductor device according to First Embodiment.

In the following embodiments, a description may be made after divided in a plurality of sections or embodiments if necessary for the sake of convenience. These sections or embodiments are not independent from each other unless otherwise particularly specified, but one of them may be a modification example, detailed description, complementary description, or the like of a part or whole of the other one.

In the following embodiments, when a reference is made to the number of elements (including the number, value, amount, range, or the like), the number is not limited to a specific number but may be more or less than the specific number, unless otherwise particularly specified or principally apparent that the number is limited to the specific number.

Further, in the following embodiments, it is needless to say that the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number, range, or the like.

Typical embodiments will hereinafter be described in detail based on drawings. In all the drawings for describing the embodiments, members having the same function will be identified by the same or like reference numerals and overlapping descriptions will be omitted. In the following embodiments, a description on the same or similar portion is not repeated in principle unless otherwise particularly necessary.

Figure 2:
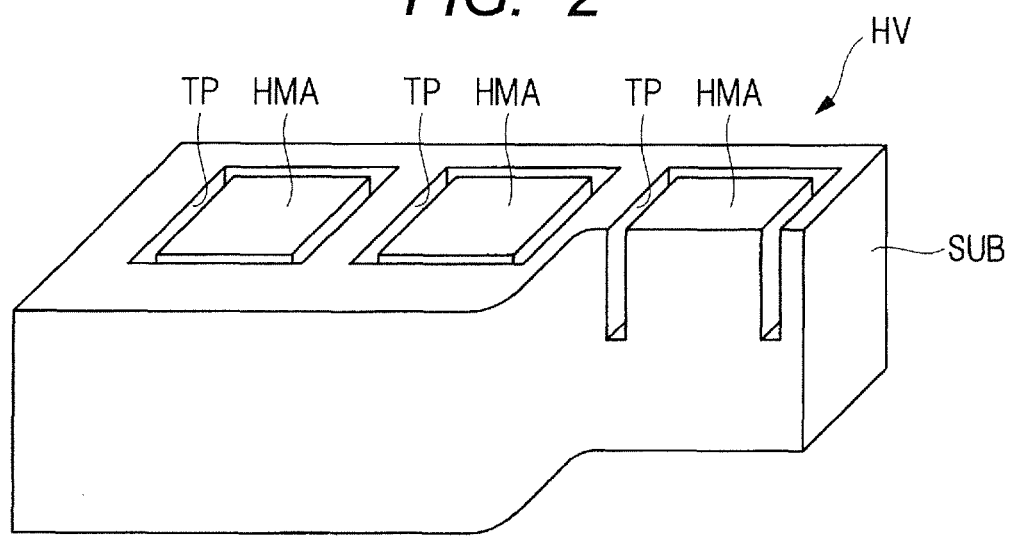
FIG. 2 is a partially cutaway perspective view showing the configuration of the semiconductor device according to First Embodiment.
Figure 3:
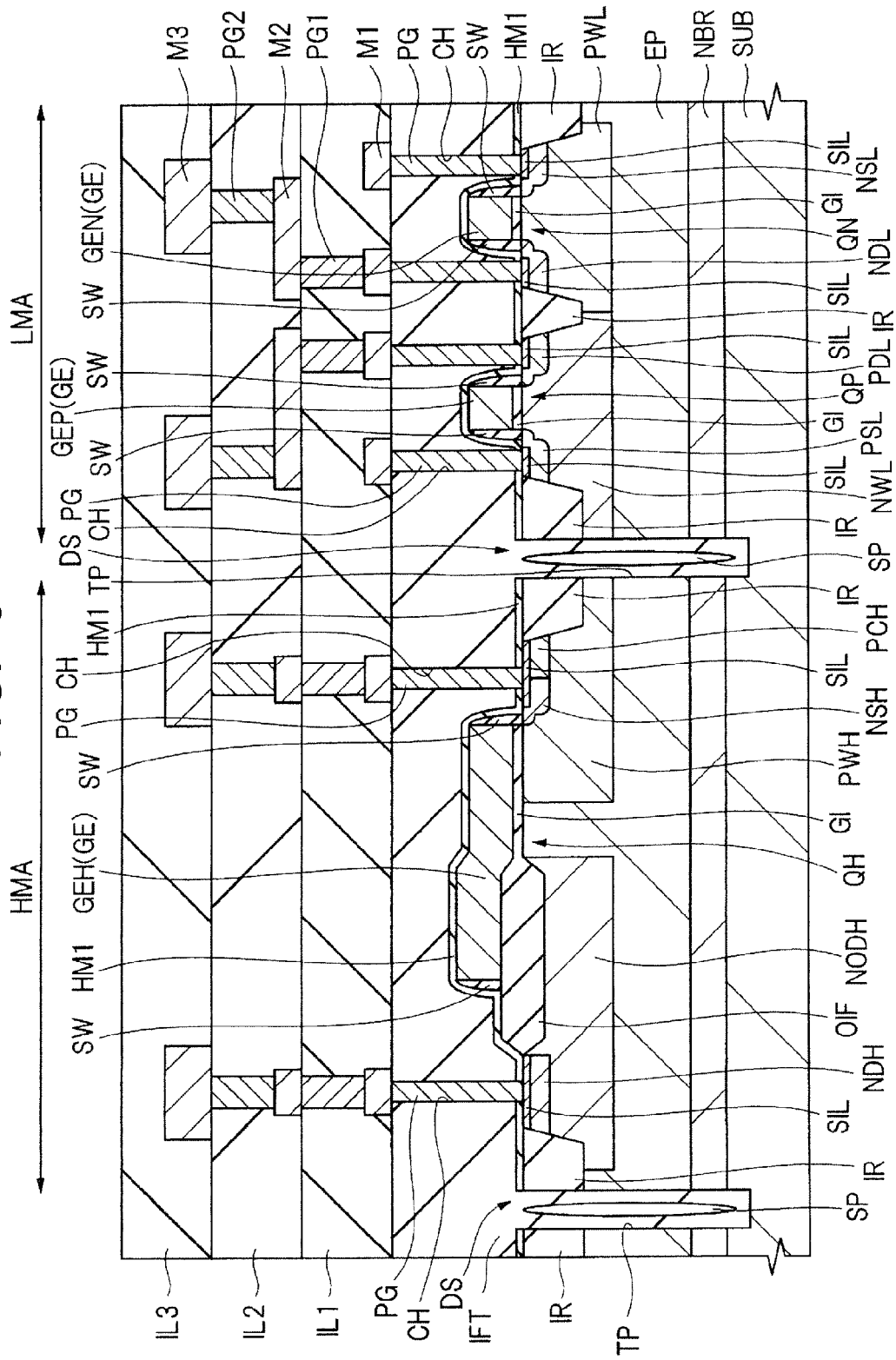
FIG. 3 is a fragmentary cross-sectional view showing the configuration of the semiconductor device according to First Embodiment.
Figure 4:
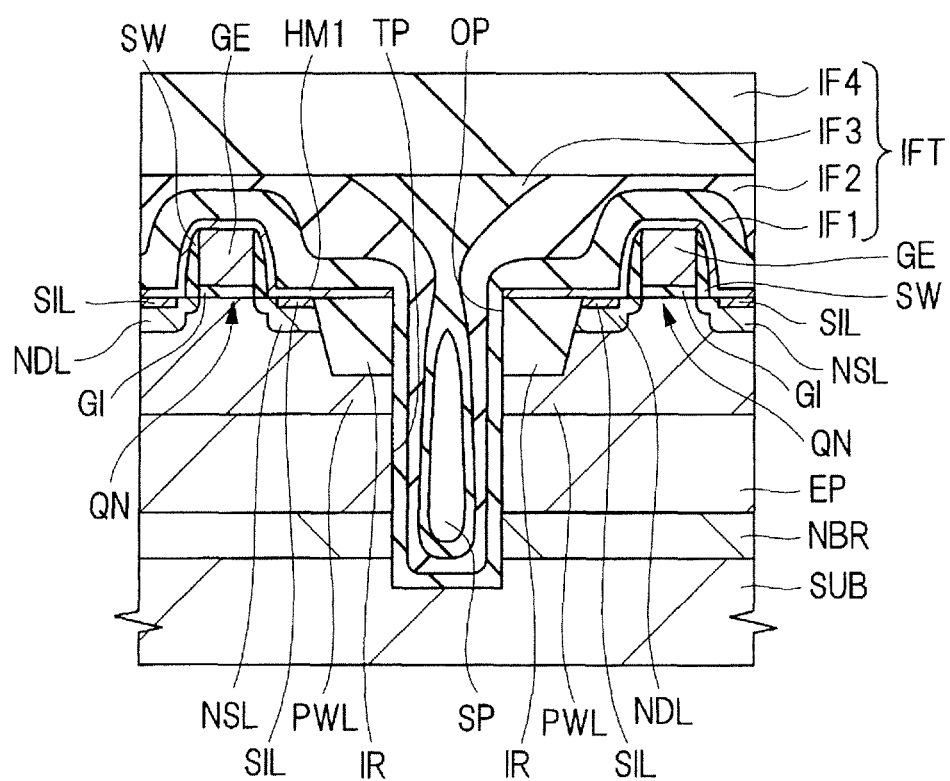
FIG. 4 is another fragmentary cross-sectional view showing the configuration of the semiconductor device according to First Embodiment.

In the drawings to be used in the following embodiments, even a cross-sectional view is sometimes not hatched to facilitate understanding of it First Embodiment Constitution of Semiconductor Device First, the configuration of a semiconductor device of First Embodiment will be described. FIG. 1 is a plan view showing the configuration of the semiconductor device of First Embodiment. FIG. 2 is a partially cutaway perspective view showing the configuration of the semiconductor device according to First Embodiment. FIG. 3 and FIG. 4 are each a fragmentary cross-sectional view showing the configuration of the semiconductor device according to First Embodiment. FIG. 4 is an enlarged cross-sectional view showing the configuration around a DTI structure.

To facilitate simple understanding, FIG. 4 shows an example of two n channel MISFETQNs having therebetween a DTI structure DS. As shown in FIG. 3, however, the DTI structure DS may be formed between LDMOSFETQH and p channel MISFETQP or between various other elements.

As shown in FIG. 1, the semiconductor device of First Embodiment is a semiconductor chip CHP of BiC-DMOS (bipolar complementary double-diffused metal oxide semiconductor). The semiconductor chip CHP has, for example, a semiconductor substrate SUB, an output driver portion HV, and a logic portion LG. The output driver portion HV includes a high breakdown voltage MOS transistor and the like formed on the semiconductor substrate SUB. The logic portion LG includes a low breakdown voltage CMOS (complementary metal oxide semiconductor) transistor and the like formed on the semiconductor substrate SUB. As will be described later referring to FIG. 3, a region having the high breakdown voltage MOS transistor therein is called "high breakdown voltage MOS region HMA", while a region having the low breakdown voltage MOS transistor therein is called "low breakdown voltage MOS region LMA".

In First Embodiment, an example having, as the high breakdown voltage MOS transistor, a laterally diffused metal oxide semiconductor field effect transistor (LDMOSFET) will be described. In First Embodiment, an example having, as the low breakdown voltage MOS transistor, a p channel MISFET (metal insulator semiconductor field effect transistor) and a CMOS transistor made of an n channel MISFET will be described.

The term "MOSFET" or "LDMOSFET" as used herein means not only MISFET using an oxide film as a gate insulating film but also MISFET using an insulating film other than the oxide film as a gate insulating film.

As shown in FIG. 2, in the output driver portion HV, the high breakdown voltage MOS region HMA in which the high breakdown voltage MOS transistor is to be formed is, in plan view, surrounded with a trench portion TP included in the DTI structure. The trench portion TP is formed in the surface, as the main surface, of the semiconductor substrate SUB. Although not illustrated in FIG. 2, in the logic portion LG, the low breakdown voltage MOS region LMA (refer to FIG. 3) in which the low breakdown voltage MOS transistor is to be formed may be surrounded, in plan view, with the trench portion TP configuring the DTI structure.

The term "plan view" as used herein means a case when viewed from a direction perpendicular to the surface, as the main surface, of the semiconductor substrate SUB.

As shown in FIG. 3, the semiconductor device of First Embodiment has the semiconductor substrate SUB equipped with the high breakdown voltage MOS region HMA and the low breakdown voltage MOS region LMA. The semiconductor substrate SUB is made of, for example, p type single crystal silicon (Si) and has the trench portion TP formed in the surface, as the main surface, of the semiconductor substrate SUB. The trench portion TP has therein an insulating film IFT. This trench portion TP and the insulating film IFT configure the DTI structure DS.

As shown in FIG. 3, in the high breakdown voltage MOS region HMA and the low breakdown voltage MOS region LMA, the semiconductor substrate SUB has an n type buried region NBR on the side of the surface, as the main surface, of the semiconductor substrate, and the n type buried region NBR has thereon a p$^-$ type epitaxial layer EP.

In the high breakdown voltage MOS region HMA, the p$^-$ type epitaxial layer EP has LDMOSFETQH as a high breakdown voltage MOS transistor. The LDMOSFETQH has the p$^-$ type epitaxial layer EP, a p type well region PWH, an n$^+$ type source region NSH, an n type offset drain region NODH, an n$^+$ type drain region NDH, a gate insulating film GI, and a gate electrode GE.

The LDMOSFET has, on the drain side thereof, a heavily doped drain region via a lightly doped offset drain region and thereby having a structure capable of securing a high drain breakdown voltage. The n type impurity concentration in the n$^+$ type drain region NDH is therefore higher than the n type impurity concentration in the n type offset drain region NODH. The gate electrode GE of the LDMOSFETQH will hereinafter be called "gate electrode GEH".

The P type well region PWH lies in the upper layer portion of the p$^-$ type epitaxial layer EP. The n$^+$ type source region NSH lies in the upper layer portion of the p type well region PWH. The n$^+$ type source region NSH and the p type well region PWH form a pn junction.

The n type offset drain region NODH lies in the upper layer portion of the p$^-$ type epitaxial layer EP. The n type offset drain region NODH and the p$^-$ type epitaxial layer EP form a pn junction. The n$^+$ type drain region NDH lies in the upper layer portion of the n type offset drain region NODH.

The n type offset drain region NODH is formed at a position away from the p type well region PWH in plan view. Therefore, the n$^+$ type source region NSH and the n type offset drain region NODH have therebetween the p type well region PWH and the p$^-$ type epitaxial layer EP along the surface of the semiconductor substrate SUB.

A portion of the gate electrode GEH on the source side lies on the p type well region PWH and also on the p$^-$ type epitaxial layer EP sandwiched between the n$^+$ type source region NSH and the n type offset drain region NODH via the gate insulating film GI. A portion of the gate electrode GEH on the drain side lies so as to run on an offset insulating film OIF formed in and on the surface of the n type offset drain region NODH. The gate electrode GEH has a sidewall spacer SW formed so as to cover the sidewall therewith.

The p type well region PWH has a p$^+$ type contact region PCH in the upper portion thereof and at a portion opposite to the gate electrode GEH with the n$^+$ type source region NSH therebetween. The p$^+$ type contact region PCH serves to control the potential of, for example, the p type well region PWH.

The n$^+$ type source region NSH, the n$^+$ type drain region NDH, and the p$^+$ type contact region PCH have, on the respective surfaces thereof, a silicide layer SIL. Although not illustrated here, the gate electrode GEH also may have, on the surface thereof, a silicide layer. Each of the n$^+$ type source region NSH, the n$^+$ type drain region NDH, and the p$^+$ type contact region PCH is however not required to have, on the surface thereof, the silicide layer SIL.

In the low breakdown voltage MOS region LMA, the p$^-$ type epitaxial layer EP has, on the surface thereof, a p channel MISFETQP and an n channel MISFETQN as a low breakdown voltage MOS transistor. The p channel MISFETQP and the n channel MISFETQN configure a CMOS transistor.

The p channel MISFETQP has an n type well region NWL, a p$^+$ type source region PSL, a p$^+$ type drain region PDL, a gate insulating film GI, and a gate electrode GE. The gate electrode GE of the p channel MISFETQP will hereinafter be called "gate electrode GEP".

The n type well region NWL lies in the upper layer portion of the p$^-$ type epitaxial layer EP in a portion of the low breakdown voltage MOS region LMA where the p channel MISFETQP is to be formed. The p$^+$ type source region PSL and the p$^+$ type drain region PDL are separated from each other in the upper layer portion of the n type well region NWL.

The gate electrode GEP of the p channel MISFETQP lies on a portion of the n type well region NWL sandwiched between the $p^+$ type source region PSL and the $p^+$ type drain region PDL via the gate insulating film GI. A sidewall spacer SW lies on the sidewall of the gate electrode GEP so as to cover it therewith.

The $p^+$ type source region PSL and the $p^+$ type drain region PDL have, on the respective surfaces thereof, a silicide layer SIL. Although not illustrated in the drawing, the gate electrode GEP may have, on the surface thereof, the silicide layer. Either one of the $p^+$ type source region PSH or the $p^+$ type drain region PDL is not required to have, on the surface thereof, the silicide layer SIL.

The n channel MISFETQN has a p type well region PWL, an $n^+$ type source region NSL, an $n^+$ type drain region NDL, a gate insulating film GI, and a gate electrode GE. The gate electrode GE of the n channel MISFETQN will hereinafter be called "gate electrode GEN".

The p type well region PWL lies in an upper layer portion of the $p^-$ type epitaxial layer EP in a portion of the low the breakdown voltage MOS region LMA in which the n channel MISFETQN is to be formed. The p type well region PWL lies at a position, in plan view, away from the n type well region NWL. The $n^+$ type source region NSL and the $n^+$ type drain region NDL are separated from each other in the upper layer portion of the p type well region PWL.

The gate electrode GEN of the n channel MISFETQP lies on a portion of the p type well region PWL sandwiched between the $n^+$ type source region NSL and the $n^+$ type drain region NDL via the gate insulating film GI. A sidewall spacer SW lies so as to cover the sidewall of the gate electrode GEN.

The $n^+$ type source region NSL and the $n^+$ type drain region NDL have, on the respective surfaces thereof, a silicide layer SIL. Although not illustrated in the drawing, the gate electrode GEN may have, on the surface thereof, a silicide layer. Either one of the $n^+$ type source region NSL or the $n^+$ type drain region NDL is not required to have, on the surface thereof, the silicide layer SIL.

An insulating film HM1 lies on the LDMOSFETQH, the p channel MISFETQP and the n channel MISFETQN so as to cover them. The insulating film HM1 is made of, for example, a silicon nitride film.

In the high breakdown voltage MOS region HMA, the DTI structure DS surrounds the LDMOSFETQH in plan view. As described above, the DTI structure DS has the trench portion TP formed in the surface, as the main surface, of the semiconductor substrate SUB and the insulating film IFT formed in the trench portion TP. Also in the low breakdown voltage MOS region LMA, in plan view, the DTI structure DS may surround therewith one or more MISFETs of the p channel MISFETQP and the n channel MISFETQN.

The trench portion TP penetrates through the insulating film HM1, an element isolation region IR, the $p^-$ type epitaxial layer EP, and the n type buried region NBR and reaches a portion of the semiconductor substrate SUB below the n type buried region NBR.

The insulating film HM1 has, thereon and also in the trench portion TP, an insulating film IFT. The trench portion TP is closed with the insulating film IFT except for a space SP. In other words, the trench portion TP is not completely filled with the insulating film IFT, but the trench portion TP has the space SP therein.

The space SP formed in the trench portion TP can decrease a leakage current of the elements separated by the DTI structure DS, increase a breakdown voltage, and at the same time, relax an electric field intensity at a position contiguous to the trench portion TP. The high breakdown voltage MOS region HMA having LDMOSFETQH as First Embodiment can enhance the effect of decreasing a leakage current of LDMOSFETQHs separated by the DTI structure DS, increasing a breakdown voltage, and at the same time, relaxing an electric field intensity at a position contiguous to the trench portion TP.

In addition, the space SP formed in the trench portion TP can suppress the action of the electric field from an adjacent element so as to disturb the extension of a depletion layer, that is, to suppress a reverse field effect, resulting in enhancement of separation breakdown voltage. Further, the space SP formed in the trench portion TP can reduce a stress in the trench portion TP and therefore can suppress generation of crystal defects due to the stress.

The trench portion TP is preferably in a region overlapping, in plan view, with the element isolation region IR. Then, the DTI structure DS is formed in the element separation region IR so that stress concentration on an upper portion of the trench portion TP can be relaxed and generation of crystal defects can be suppressed further.

As shown in FIG. 4, the insulating film IFT is an insulating film obtained by stacking insulating films IF1, IF2, IF3, and IF4 one after another in order of mention. The insulating film IF1 is made of a silicon oxide film formed by chemical vapor deposition (CVD) using a gas containing an ozone ($O_3$) gas and a tetraethoxysilane (TEOS) gas. The insulating film IF2 is made of a silicon oxide film formed using plasma-enhanced chemical vapor deposition (PECVD). The insulating film IF3 is made of a silicon oxide film formed by CVD using a gas containing an $O_3$ gas and a TEOS gas. The insulating film IF4 is made of a silicon oxide film formed by PECVD.

As shown in FIG. 3, the insulating film IFT and the insulating film HM1 have therein a contact hole CH and the contact hole CH has therein a plug PG. In the high breakdown voltage MOS region HMA, the plug PG is electrically coupled to each of the $n^+$ type source region NSH, the $n^+$ type drain region NDH, and the $p^+$ type contact region PCH via the silicide layer SIL. In the low breakdown voltage MOS region LMA, the plug PG is electrically coupled to each of the $p^+$ type source region PSL, the $p^+$ type drain region PDL, the $n^+$ type source region NSL, and the $n^+$ type drain region NDL via the silicide layer SIL.

Although not illustrated in the drawing, in both the high breakdown voltage MOS region HMA and the low breakdown voltage MOS region LMA, the plug PG is electrically coupled to each of the gate electrodes GEH, GEP, and GEN.

As shown in FIG. 3, the insulating film IFT has thereon a first-layer wiring M1. The wiring M1 is electrically coupled to the plug PG in the contact hole CH. The insulating film IFT and also the first-layer wiring M1 have thereon an interlayer insulating film IL1. The interlayer insulating film IL1 has therein a plug PG1 penetrating through the interlayer insulating film IL1 and reaching the wiring M1.

The interlayer insulating film IL1 has thereon a second-layer wiring M2. The wiring M2 is electrically coupled to the plug PG1 penetrating through the interlayer insulating film IL1. The interlayer insulating film IL1 and also the second-layer wiring M2 have thereon an interlayer insulating film IL2. The interlayer insulating film IL2 has therein a plug PG2 penetrating through the interlayer insulating film IL2 and reaching the wiring M2.

The interlayer insulating film IL2 has thereon a third-layer wiring M3. The wiring M3 is electrically coupled to the plug PG2 penetrating through the interlayer insulating film IL2. The interlayer insulating film IL2 and also the third-layer wiring M3 have thereon an interlayer insulating film IL3.

<Method of Manufacturing Semiconductor Device>

Figure 5:
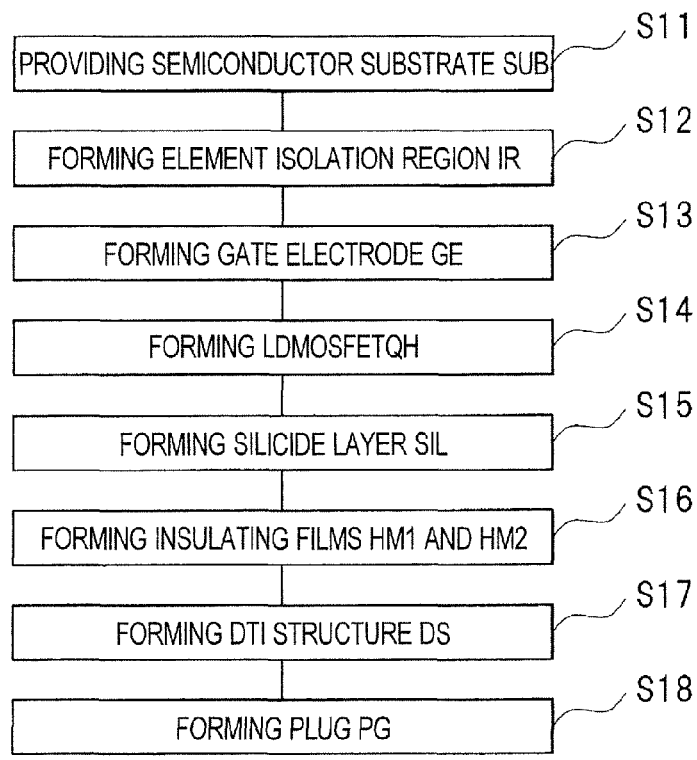
FIG. 5 is a manufacturing process flow chart showing some of manufacturing steps of the semiconductor device according to First Embodiment.
Figure 6:
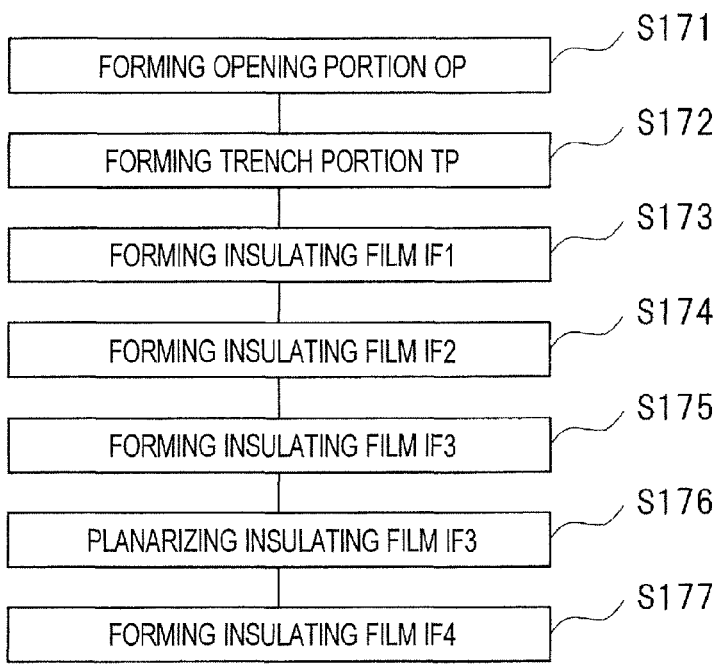
FIG. 6 is also a manufacturing process flow chart showing some of manufacturing steps of the semiconductor device according to First Embodiment.

Next, a method of manufacturing a semiconductor device according to the present embodiment will be described. FIGS. 5 and 6 are manufacturing process flow charts showing some of the manufacturing steps of the semiconductor device of First Embodiment. FIG. 6 shows the manufacturing steps included in Step 17 of FIG. 5. FIGS. 7 to 23 are fragmentary cross-sectional views during the manufacturing steps of the semiconductor device of First Embodiment. Of these, FIGS. 14 to 22 are enlarged cross-sectional views showing the configuration around the DTI structure during the manufacturing steps shown in FIG. 6 and included in Step S17.

Figure 13:
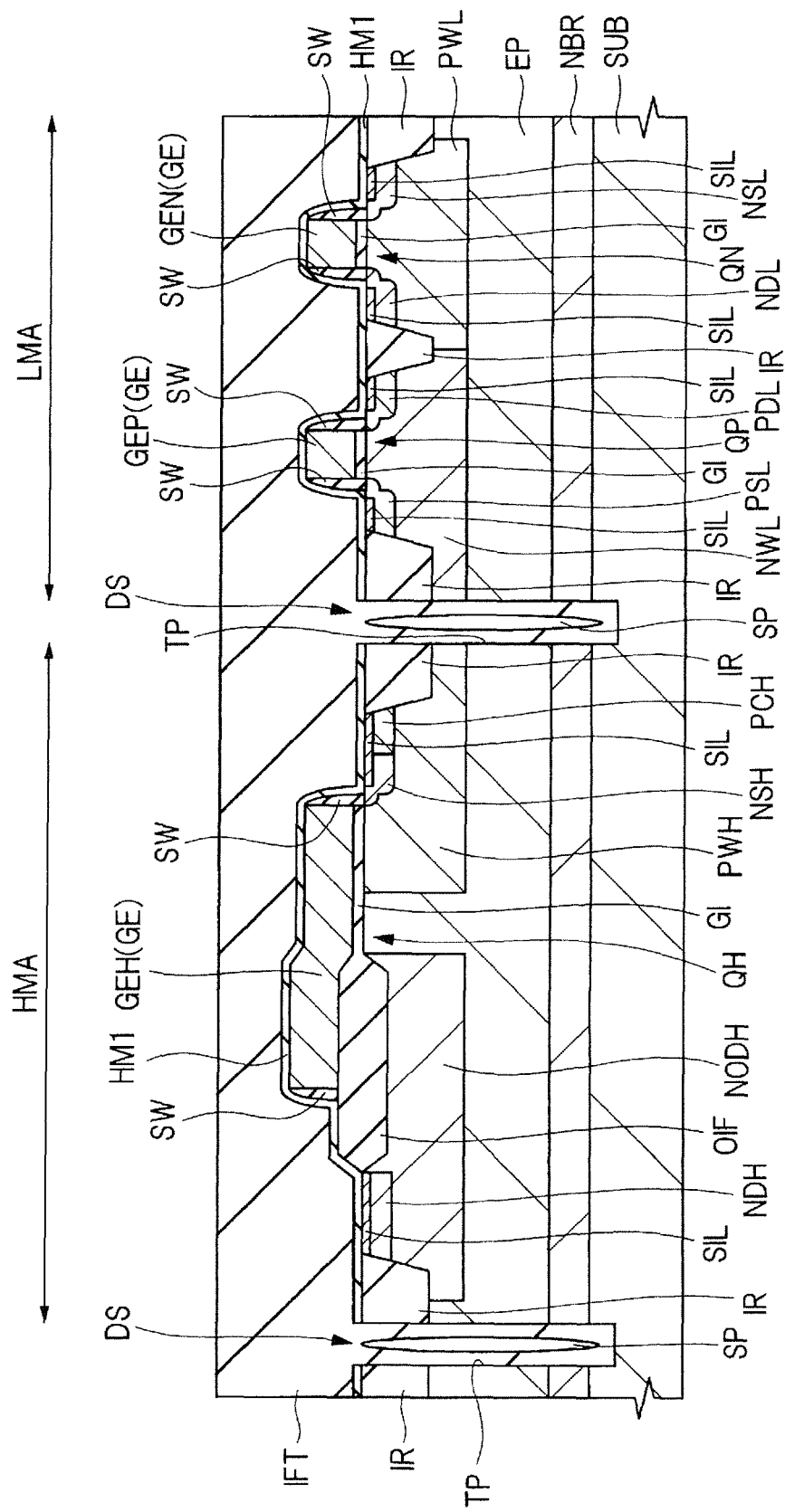
FIG. 13 is a fragmentary cross-sectional view of the semiconductor device according to First Embodiment during a still further manufacturing step thereof.

To facilitate understanding, FIGS. 14 to 16, FIG. 18, and FIGS. 20 to 22 show an example of forming a DTI structure DS between two n channel MISFETQNs. As shown in FIG. 13 and FIG. 23, however, the DTI structure DS may be formed between LDMOSFETQH and the p channel MISFETQP or may be formed between various other elements.

Figure 7:
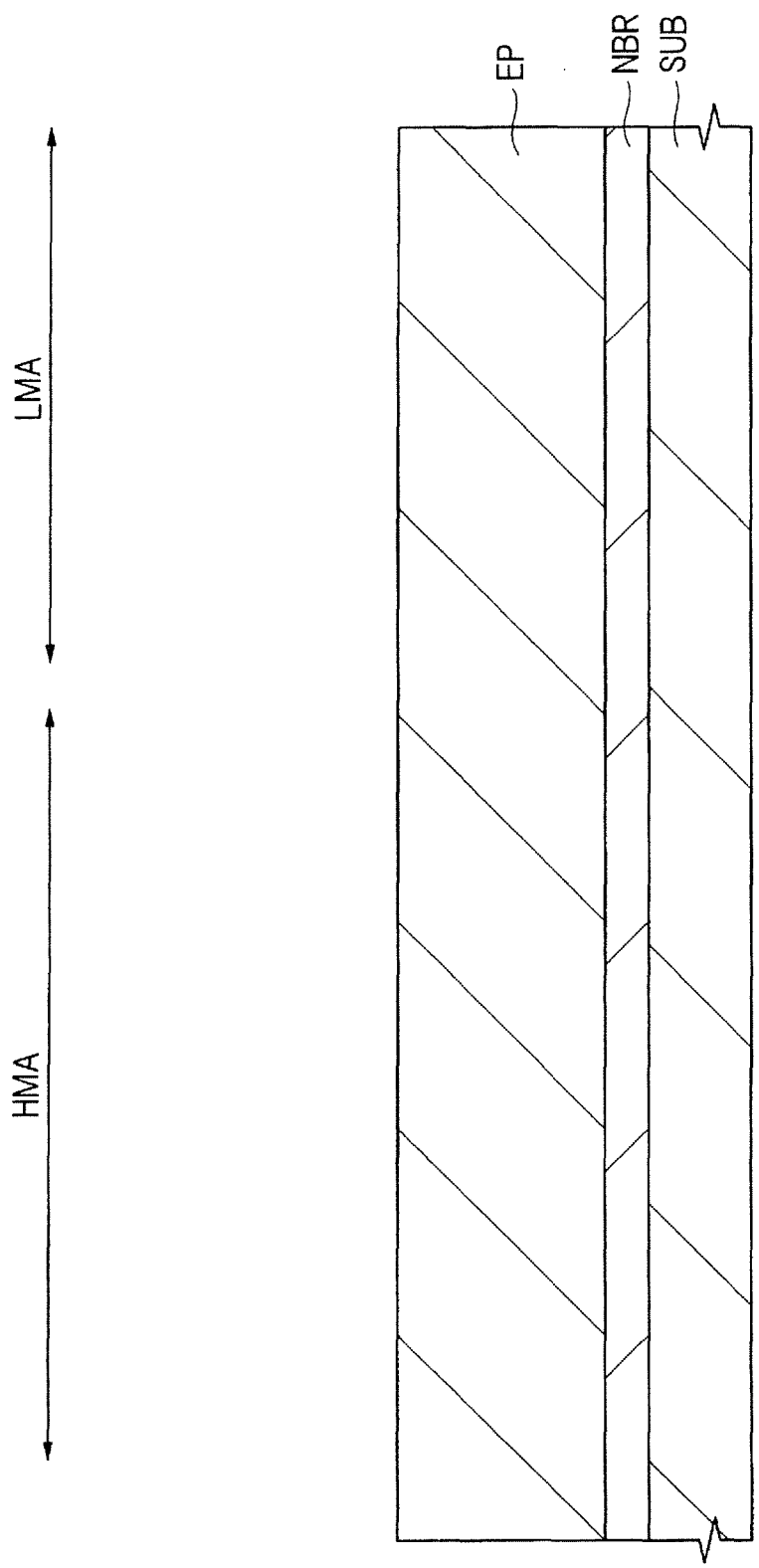
FIG. 7 is a fragmentary cross-sectional view of the semiconductor device according to First Embodiment during a manufacturing step thereof.

As shown in FIG. 7, a semiconductor substrate SUB is provided (Step S11 in FIG. 5). The semiconductor substrate SUB provided in this step S11 is a low resistance substrate made of, for example, p type single crystal silicon (Si) and having a resistivity (specific resistance) of, for example, from about 1 to 10 mΩ/cm. The semiconductor substrate SUB has a high breakdown voltage MOS region HMA and a low breakdown voltage MOS region LMA as a region on the side of a surface, as the main surface, of the semiconductor substrate SUB. The semiconductor substrate SUB has, on the side of the surface as the main surface thereof, an n type buried region NBR. Then, a p⁻ type epitaxial layer EP made of, for example, p type single crystal Si is formed on the surface of the semiconductor substrate SUB by a known epitaxial growth method.

Figure 8:
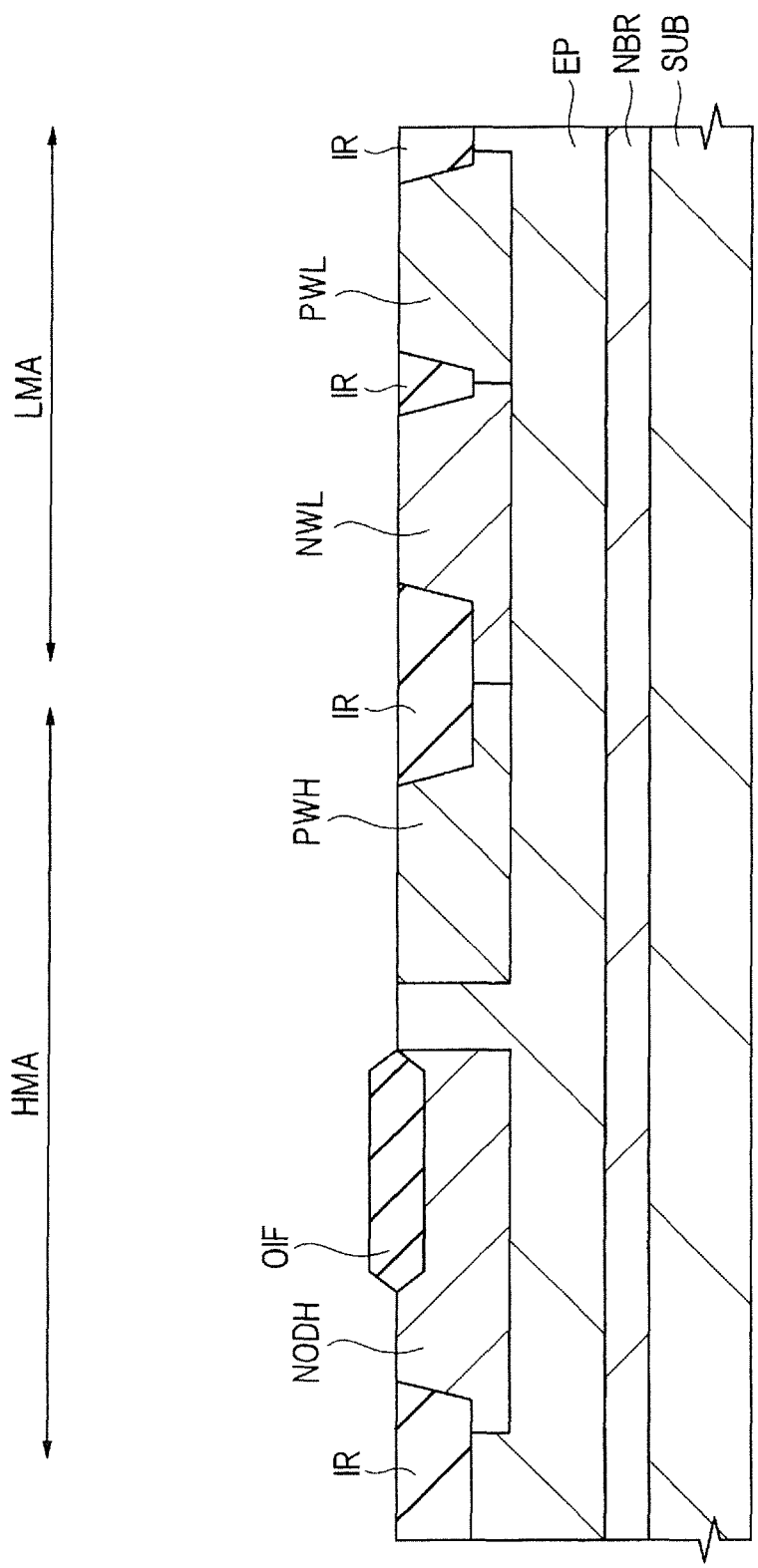
FIG. 8 is a fragmentary cross-sectional view of the semiconductor device according to First Embodiment during another manufacturing step thereof.

Next, as shown in FIG. 8, an element isolation region IR is formed (Step S12 in FIG. 5). The element isolation region IR formed as an insulating film in this Step S12 is formed on the surface, as the main surface, of the semiconductor substrate SUB, that is, on the surface of the p⁻ type epitaxial layer EP, for example, by STI (shallow trench isolation) or LOCOS (local oxidization of silicon). Formation of the element isolation region IR by STI will next be described.

First, by dry etching with an unillustrated photoresist pattern as an etching mask, the p⁻ type epitaxial layer EP is removed from a region where the element isolation region IR is formed to form an element isolation trench.

Next, an insulating film made of silicon oxide is deposited on the surface of the p⁻ type epitaxial layer EP by CVD or the like to fill the element isolation trench with the insulating film. In other words, an insulating film made of a silicon oxide film is formed on the surface of the semiconductor substrate SUB. As the silicon oxide film, a silicon oxide film having good fluidity such as a silicon oxide film formed by CVD using a gas containing, for example, an ozone ($O_3$) gas and a tetraethoxysilane (TEOS) having good fluidity can be used. The definition of the fluidity will be described later.

Next, the insulating film is polished by CMP (chemical mechanical polishing) or the like to planarize the surface of the insulating film. As a result, the element isolation region IR as an insulating film is formed, buried in the element isolation trench.

In Step S12, in the high breakdown voltage MOS region HMA, an offset insulating film OIF made of a silicon oxide film is formed, separately from the element isolation region IR, in and on the surface of the p⁻ type epitaxial layer EP, for example, by LOCOS which is a method of forming a film by thermal oxidation with a mask. Instead of LOCOS, STI may be used for the formation of the offset insulating film OIF.

Figure 9:
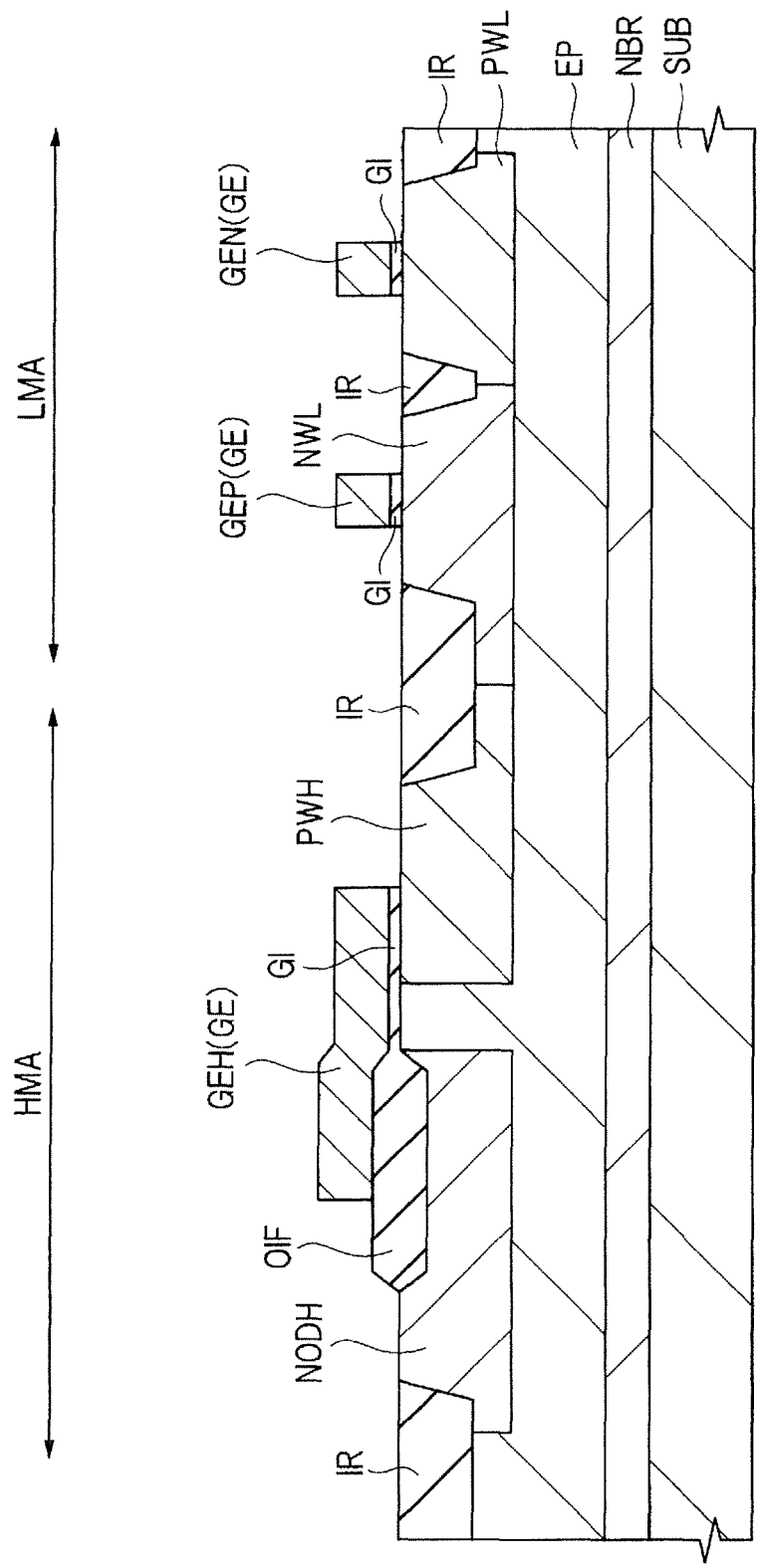
FIG. 9 is a fragmentary cross-sectional view of the semiconductor device according to First Embodiment during a further manufacturing step thereof.

Next, as shown in FIG. 9, a gate electrode GE is formed (Step S13 in FIG. 5). In this step S13, with an unillustrated photoresist pattern as a mask, a p type impurity such as boron (B) is introduced into a portion of the p⁻ type epitaxial layer EP by ion implantation to form a p type well region PWB in the high breakdown voltage MOS region HMA and a p type well region PWH in the low breakdown voltage MOS region LMA. After the ion implantation, annealing for activating the introduced impurity, that is, heat treatment may be performed.

With an unillustrated photoresist pattern as a mask, an n type impurity such as phosphorus (P) or arsenic (As) is introduced into the p⁻ type epitaxial layer EP by ion implantation to form an n type offset drain region NODH in the high breakdown voltage MOS region HMA and an n type well region NWL in the low breakdown voltage MOS region LMA. The n type offset drain region NODH is formed at a position away from the p type well region PWH in plan view. After the ion implantation, annealing for activating the introduced impurity, that is, heat treatment may be performed.

Next, the semiconductor substrate SUB is subjected to, for example, thermal oxidation to form a gate insulating film GI made of a silicon oxide film or the like on the surface of the p⁻ type epitaxial layer EP. As the gate insulating film GI, a nitrogen-containing silicon oxide film, so-called oxynitride film may be used instead of the thermal oxide film.

Next, for example, a conductor film made of a polycrystalline silicon film having an n type impurity introduced therein is formed on the gate insulating film GI by CVD or the like.

Next, the conductor film and the gate insulating film GI are patterned by photolithography and dry etching. By this patterning, a gate electrode GEH, that is, a gate electrode GE of the LDMOSFETQH (refer to FIG. 10), is formed in the high breakdown voltage MOS region HMA. In the low breakdown voltage MOS region LMA, a gate electrode GEP, that is, a gate electrode GE of the p channel MISFETQP (refer to FIG. 10), is formed, while in the low breakdown voltage MOS region LMA, a gate electrode GEN, that is, a gate electrode GE in the n channel MISFETQN (refer to FIG. 10), is formed.

In the high breakdown voltage MOS region HMA, the gate electrode GEH starts from above the p type well region PWH, goes over the p⁻ type epitaxial layer EP, and extends over the offset insulating film OIF on the n type offset drain region NODH. This means that a portion of the gate electrode GEH on the source side is formed over the p type well region PWH and the p⁻ type epitaxial layer EP via the gate insulating film GI. A portion of the gate electrode GEH on the drain side is formed over the n type offset drain region NODH via the offset insulating film OIF.

On the other hand, in the low breakdown voltage MOS region LMA, the gate electrode GEP is formed over the n type well region NWL and the gate electrode GEN is formed over the p type well region PWL.

Figure 10:
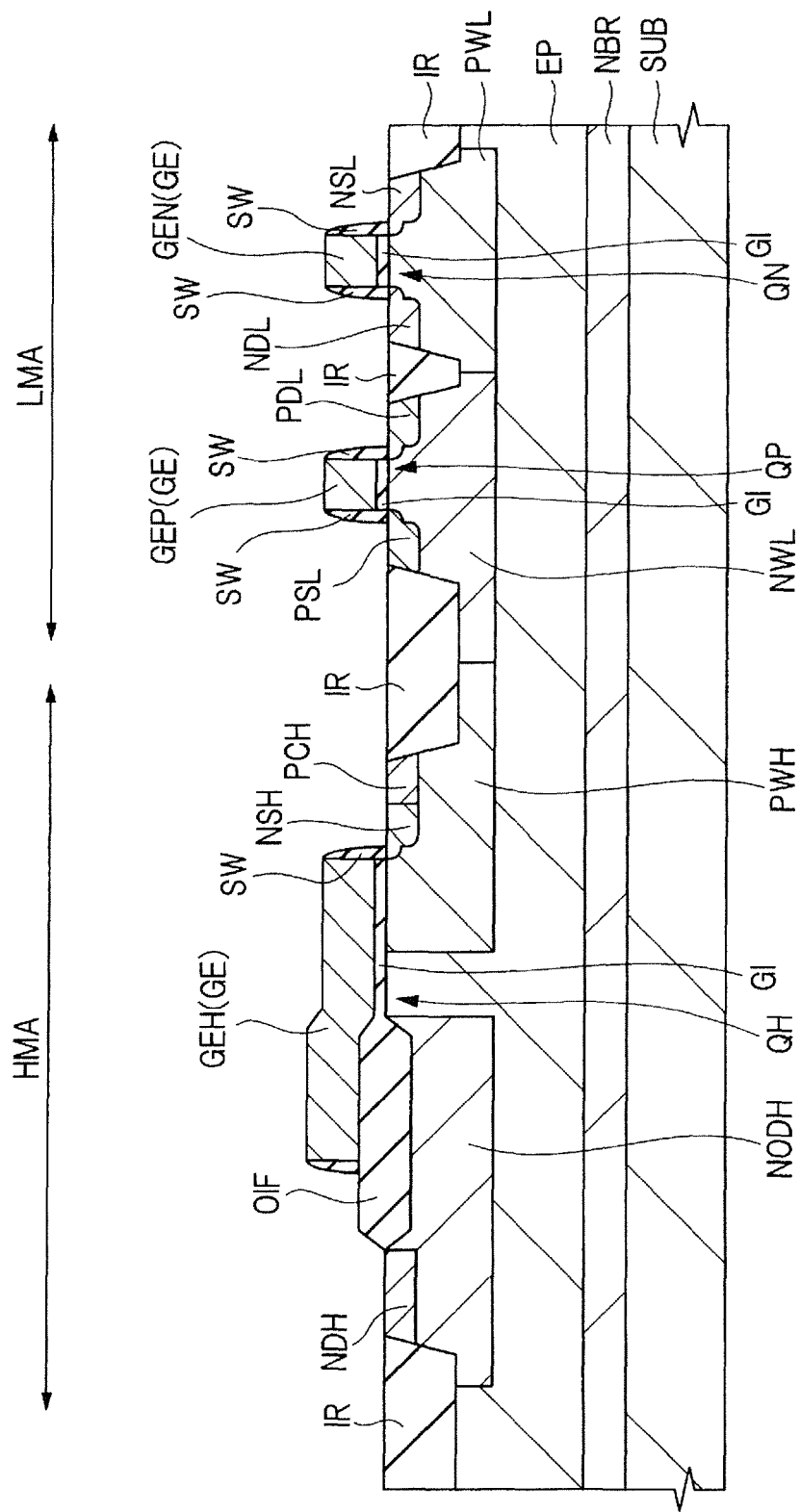
FIG. 10 is a fragmentary cross-sectional view of the semiconductor device according to First Embodiment during a still further manufacturing step thereof.

Next, as shown in FIG. 10, LDMOSFETQH is formed (Step S14 in FIG. 5). In this step S14, a p type impurity such as boron (B) is introduced into a portion of the surface of the semiconductor substrate SUB by ion implantation and an n type impurity such as phosphorus (P) or arsenic (As) is introduced into another portion of the surface of the semiconductor substrate SUB by ion implantation.

A sidewall spacer SW made of an insulating film such as a silicon oxide film is formed on the sidewall of the gate electrodes GEH, GEP, and GEN. The sidewall spacer SW is formed, for example, by depositing an insulating film such as silicon oxide film on the semiconductor substrate SUB by CVD or the like and then anisotropically etching the deposited insulating film.

Moreover, after formation of the sidewall spacer SW, a p type impurity such as boron (B) is introduced into a portion of the surface of the semiconductor substrate SUB by ion implantation and an n type impurity such as phosphorus (P) or arsenic (As) is introduced into another portion of the surface of the semiconductor substrate SUB by ion implantation.

As a result, in the high breakdown voltage MOS region HMA, an n⁻ type source region NSH is formed in an upper layer portion of the p type well region PWH. The n⁻ type source region NSH is formed so that an end portion of the n⁻ type source region NSH is in self alignment with the gate electrode GEH. A p⁺ type contact region PCH is formed in an upper portion of the p type well region PWH on the side opposite to the gate electrode GEH with the n⁻ type source region NSH between them.

In the high breakdown voltage MOS region HMA, an n⁺ type drain region NDH is formed in an upper layer portion of the n type offset drain region NODH. The n⁺ type drain region NDH is formed in the upper layer portion of the n type offset drain region NODH sandwiched between the element isolation region IR and the offset insulating film OIF.

By the above-mentioned steps, formed in the high breakdown voltage MOS region HMA is the LDMOSFETQH having the p⁻ type epitaxial layer EP, the p type well region PWH, the n⁻ type source region NSH, the n type offset drain region NODH, the n⁺ type drain region NDH, the gate insulating film GI, and the gate electrode GEH. By providing the heavily-doped drain region on a drain side via the lightly doped offset drain region, the LDMOSFET is capable of securing a high drain breakdown voltage. The n type impurity concentration in the n⁺ type drain region NDH is therefore made higher than the n type impurity concentration in the n type offset drain region NODH.

In the low breakdown voltage MOS region LMA, on the other hand, a p⁺ type source region PSL and a p⁺ type drain region PDL are formed in an upper layer portion of the n type well region NWL. The p⁺ type source region PSL and the p⁺ type drain region PDL are formed, respectively, in two portions in the upper layer portion of the n type well region NWL opposite to each other with the gate electrode GEP therebetween so as to be in alignment with the gate electrode GEP.

By the above-mentioned steps, formed in the low breakdown voltage MOS region LMA is a p channel MISFETQP having the n type well region NWL, p⁺ type source region PSL, p⁺ type drain region PDL, gate insulating film GI, and gate electrode GEP.

In addition, in the low breakdown voltage MOS region LMA, an n⁺ type source region NSL and an n⁺ type drain region NDL are formed in an upper layer portion of the p type well region PWL. The n⁺ type source region NSL and the n⁺ type drain region NDL are formed, respectively, in two portions in the upper layer portion of the p type well region PWL opposite to each other with the gate electrode GEN therebetween so as to be in alignment with the gate electrode GEN.

By the above-mentioned steps, formed in the low breakdown voltage MOS region LMA is an n channel MISFETQN having the p type well region PWL, n⁺ type source region NSL, n⁺ type drain region NDL, gate insulating film GI, and gate electrode GEN.

The n⁺ type source region NSH, n⁺ type source region NSL, and n⁺ type drain region NDL can be formed as a source/drain region having an LDD (lightly doped drain) structure comprised of an n⁻ type semiconductor region and an n⁺ type semiconductor region having an n type impurity concentration higher than that in the n⁻ type semiconductor region. The p⁺ type source region PSL and the p⁻ type drain region PDL can be formed as a source/drain region having an LDD structure comprised of a p⁻ type semiconductor region and a p⁺ type semiconductor region having a p type impurity concentration higher than that in the p⁻ type semiconductor region.

Figure 11:
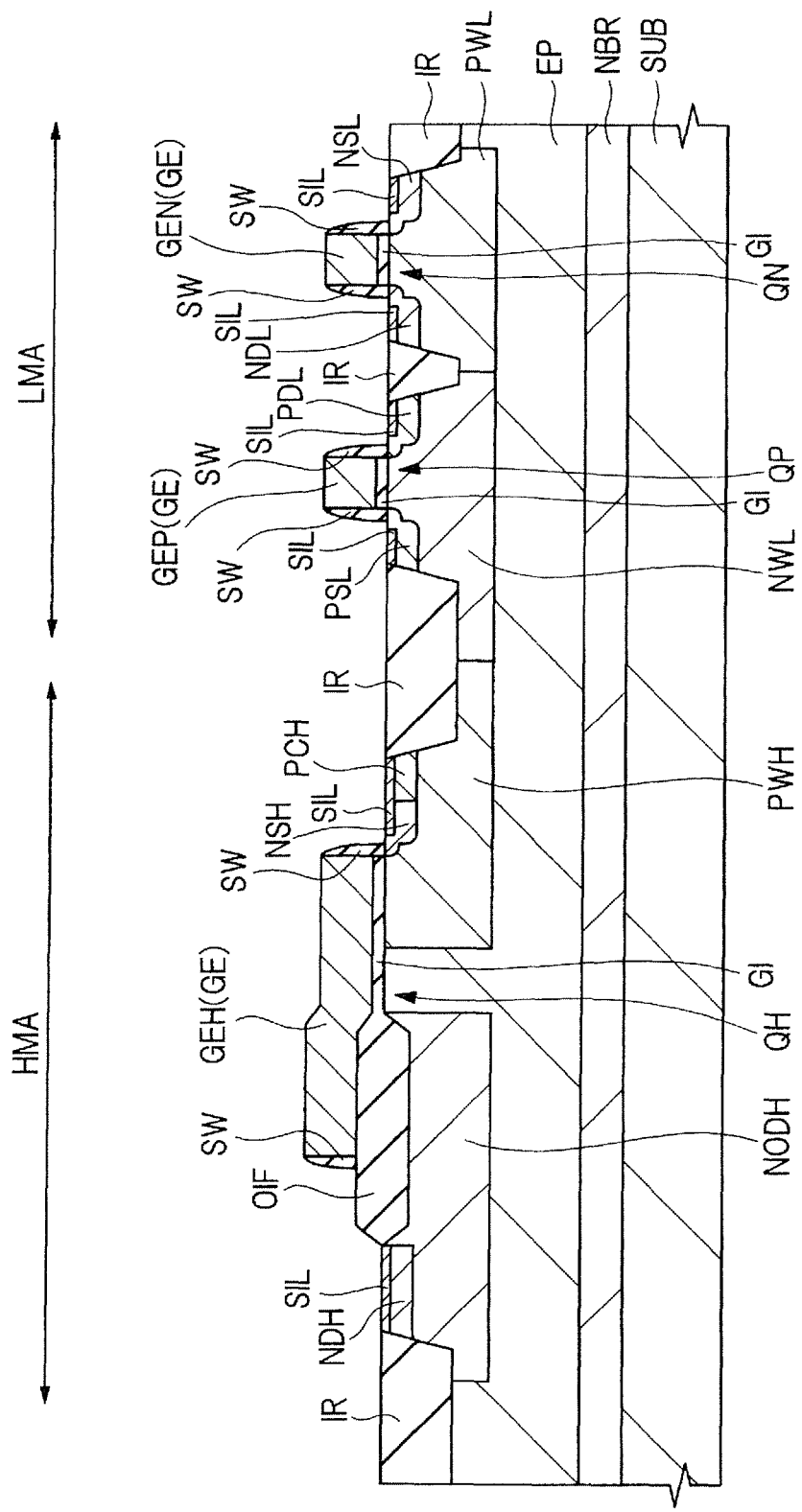
FIG. 11 is a fragmentary cross-sectional view of the semiconductor device according to First Embodiment during a still further manufacturing step thereof.

Next, as shown in FIG. 11, a silicide layer SIL is formed (Step S15 in FIG. 5). In Step S15, a silicide layer SIL is formed on the surface of each of the n⁺ type source region NSH, n⁺ type drain region NDH, and p⁺ type contact region PCH in the high breakdown voltage MOS region HMA. Further, a silicide layer SIL is formed on the surface of each of the p⁺ type source region PSL, p⁺ type drain region PDL, n⁺ type source region NSL, and n⁺ type drain region NDL in the low breakdown voltage MOS region LMA. The silicide layer SIL is made of, for example, a metal silicide film such as cobalt silicide film. The silicide layer SIL can be formed, for example, by the salicide (self aligned silicide) process.

This makes it possible to reduce the contact resistance between each of the n⁺ type source region NSH, n⁺ type drain region NDH, p⁺ type contact region PCH, p⁺ type source region PSL, p⁺ type drain region PDL, n⁺ type source region NSL, and n⁺ type drain region NDL and a plug PG (refer to FIG. 23).

Figure 12:
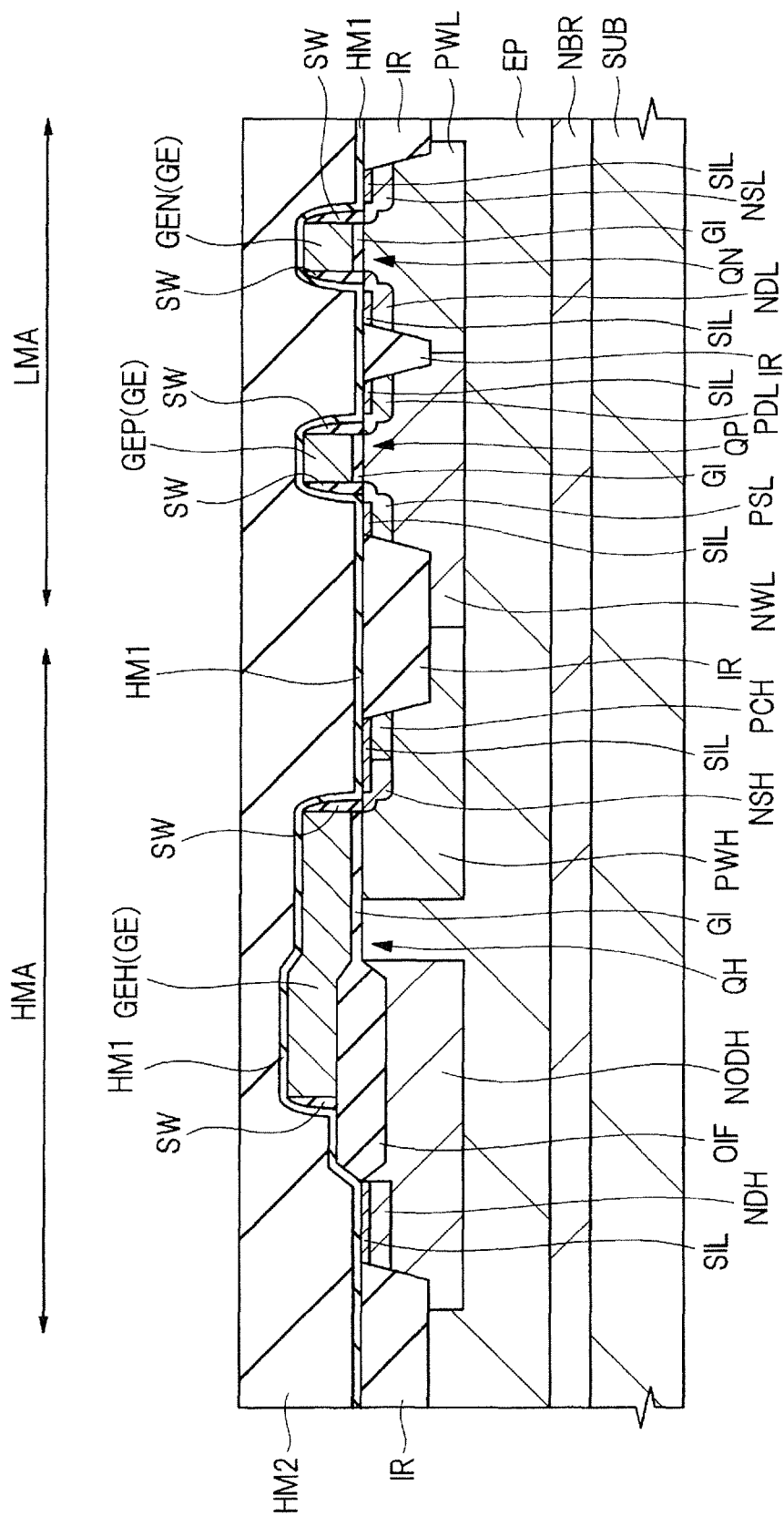
FIG. 12 is a fragmentary cross-sectional view of the semiconductor device according to First Embodiment during a still further manufacturing step thereof.

Next, as shown in FIG. 12, insulating films HM1 and HM2 are formed (Step S16 in FIG. 5). In this step S16, an insulating film HM1 made of, for example, a silicon nitride film is formed on the surface of the semiconductor substrate SUB and also on the element isolation region IR as an insulating film, on the LDMOSFETQH, on the p channel MISFETQP, and on the n channel MISFETQN. After formation of the insulating film HM1, an insulating film HM2 made of, for example, a silicon oxide film is formed on the insulating film HM1. The thickness of the insulating film HM2 is greater than that of the insulating film HM1. The insulating film HM1 made of a silicon nitride film and the insulating film HM2 made of a silicon nitride film can be formed, for example, by CVD. After deposition of the insulating film HM2, the surface of the insulating film HM2 is planarized as needed by CMP or the like.

The insulating film HM1 made of a silicon nitride film functions as an etching stopper film when a DTI structure which will be described later referring to FIG. 13 and the like is formed or functions as an etching stopper film when a contact hole CH which will be described later referring to FIG. 23 is formed.

Next, as shown in FIG. 13, a DTI structure DS is formed (Step S17 in FIG. 5). In this step S17, a trench portion TP is formed in the surface of the semiconductor substrate SUB and then, an insulating film IFT is formed so as to close the trench portion TP therewith. Step S17 includes Steps S171 to S177 in FIG. 6. The steps from Step S171 to S177 in FIG. 6 will next be described referring to FIGS. 14 to 22 and FIG. 4.

Figure 14:
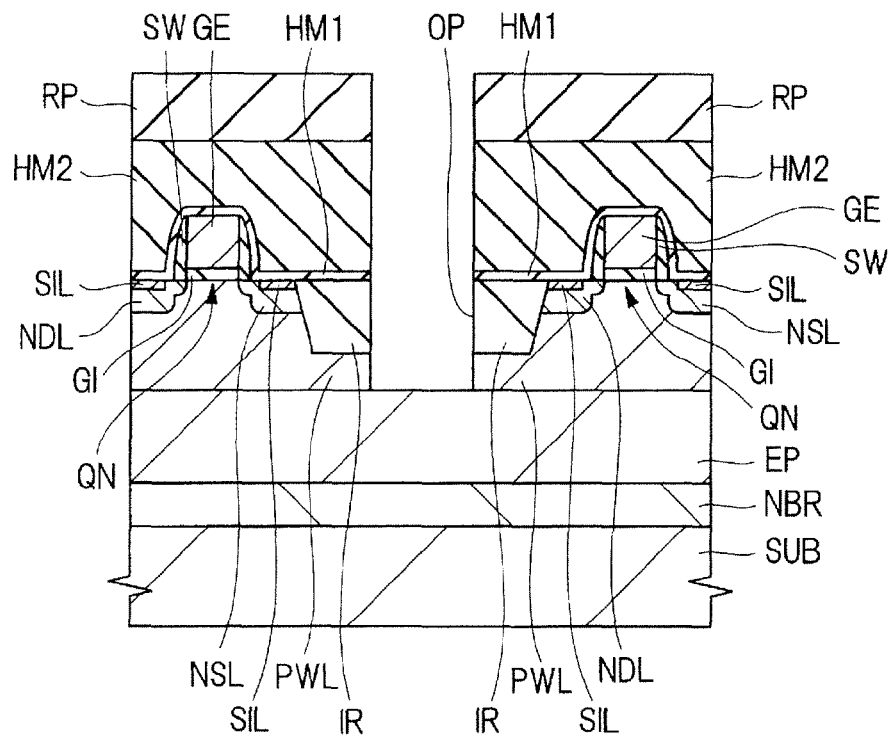
FIG. 14 is a fragmentary cross-sectional view of the semiconductor device according to First Embodiment during a still further manufacturing step thereof.

First, as shown in FIG. 14, an opening portion OP is formed (Step S171 in FIG. 6). In this Step S171, in a region in which the DTI structure DS is to be formed, formed is an opening portion OP penetrating through the insulating film HM2, insulating film HM1, and element isolation region IR as an insulating film and reaching the surface of the semiconductor substrate SUB such as p type well region PWL.

A photoresist is applied onto the insulating film HM2 and the photoresist thus obtained is patterned by photolithography to form a resist pattern RP having an opening portion penetrating through the photoresist and reaching the insulating film HM2. With this resist pattern RP as an etching mask, the insulating film HM2, insulating film HM1, and element isolation region IR are etched successively. As a result, an opening portion OP penetrating through the insulating film HM2, insulating film HM1, and element isolation region IR and reaching the surface of the semiconductor substrate SUB such as p type well region PWL is formed.

The insulating film HM2 is not always necessary and if it is not formed, the opening portion OP penetrates through the insulating film HM1 and element isolation region IR and reaches the surface of the semiconductor substrate SUB, for example, the p type well region PWL.

Alternatively, both the insulating film HM2 and the insulating film HM1 may be omitted and if so, the opening portion OP penetrates through the element isolation region IR and reaches the surface of the semiconductor substrate SUB, for example, the p type well region PWL.

Figure 15:
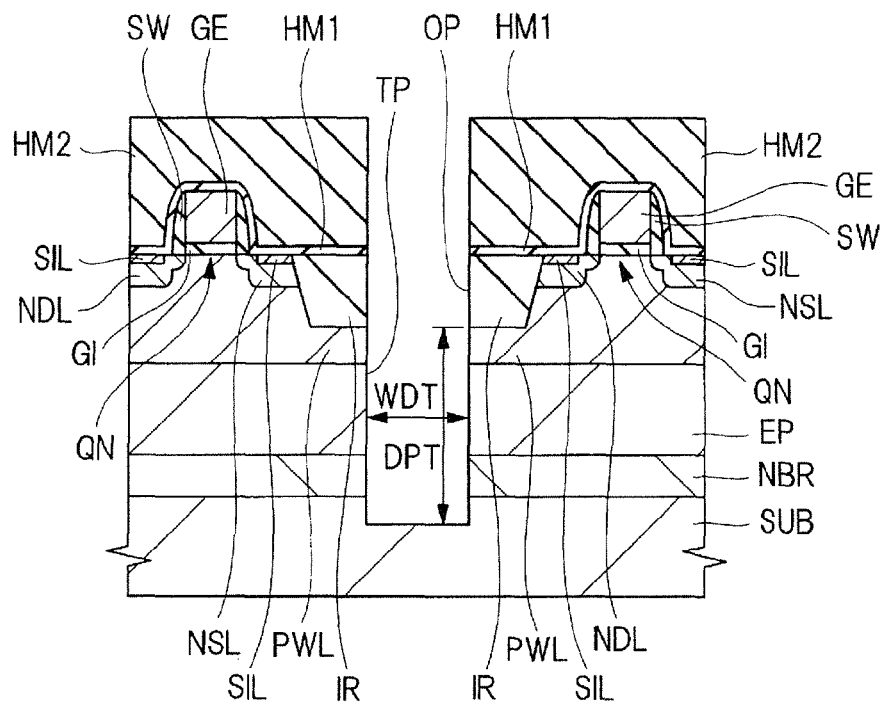
FIG. 15 is a fragmentary cross-sectional view of the semiconductor device according to First Embodiment during a still further manufacturing step thereof.

Next, as shown in FIG. 15, a trench portion TP is formed (Step S172 in FIG. 6). In this Step S172, for example, after removal of the resist pattern RP, with the insulating film HM2, insulating film HM1, and element isolation region IR having therein the opening portion OP as an etching mask, the semiconductor substrate SUB made of, for example, single crystal Si such as the p type well region PWL exposed from the bottom surface of the opening portion OP is etched by dry etching. By this etching, a trench portion TP communicated with the opening portion OP, penetrating through the p type well region PWL exposed from the bottom surface of the opening portion OP, and reaching the middle, in the thickness direction, of the semiconductor substrate SUB is formed in the surface of the semiconductor substrate SUB.

The depth DPT of the trench portion TP can be set at, for example, 15 μm and the width WDT of the trench portion TP can be set at, for example, 1 μm.

In the example shown in FIG. 15, the trench portion TP is formed in a region overlapping with the element isolation region IR in plan view. The trench portion TP may however be formed in a region not overlapping with the element isolation region IR in plan view. At this time, the opening portion OP penetrates through the insulating film HM2 and the insulating film HM1 and reaches the surface of the semiconductor substrate SUB, for example, the p type well region PWL.

Although not shown in FIG. 15, the trench portion TP may be formed so as to surround therewith any of the LDMOSFETQH, p channel MISFET, and n channel MISFETQN in plan view.

Figure 16:
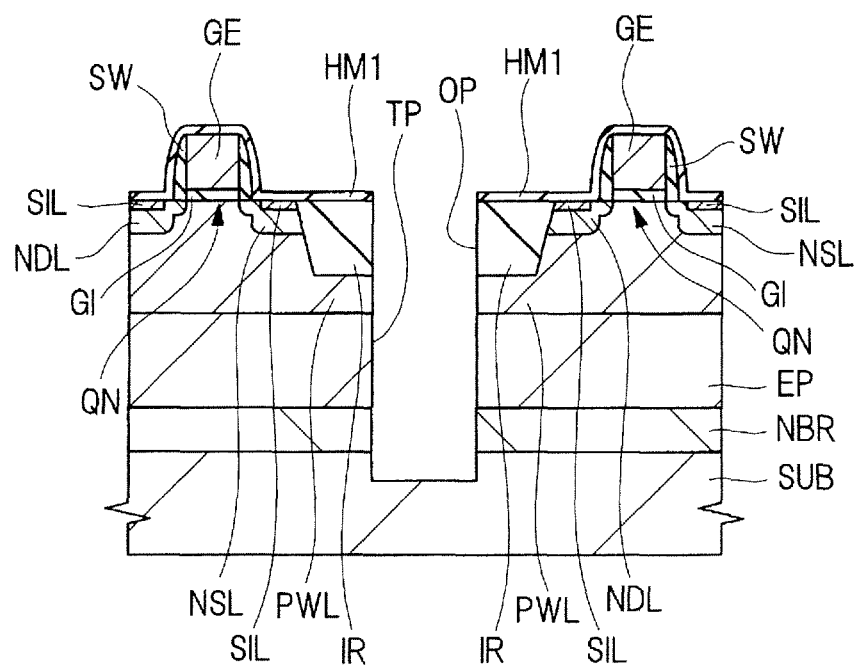
FIG. 16 is a fragmentary cross-sectional view of the semiconductor device according to First Embodiment during a still further manufacturing step thereof.

After this Step S172, the insulating film HM2 made of a silicon oxide film is removed, for example, by isotropic etching as shown in FIG. 16.

Figure 17:
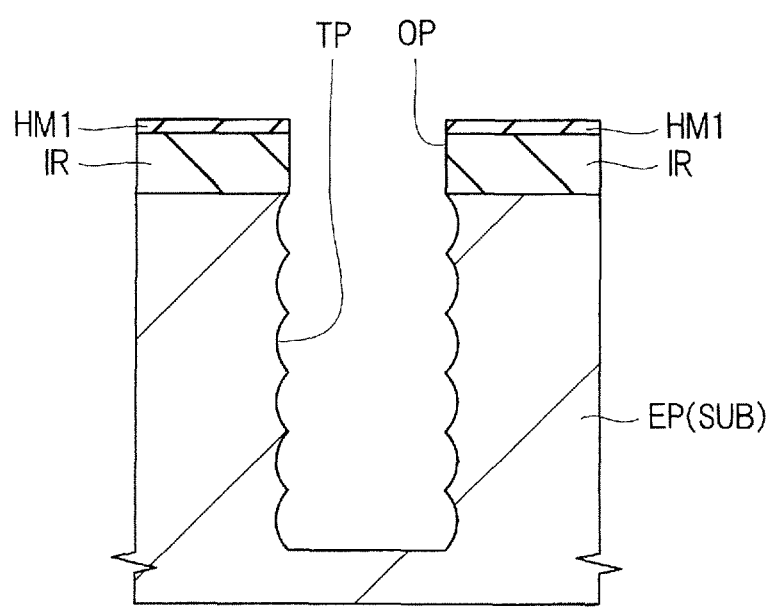
FIG. 17 is a fragmentary cross-sectional view of the semiconductor device according to First Embodiment during a still further manufacturing step thereof.

When a trench portion TP having a high aspect ratio (the term "aspect ratio" as used herein means a ratio of the depth DPT to the width WDT") is formed by dry etching, a step of etching the semiconductor substrate SUB with a gas containing, for example, a sulfur hexafluoride ($SF_6$) gas and a step of covering the side surface of the trench portion TP with a gas containing, for example, a carbon fluoride (fluorocarbon) gas such as $C_4F_8$ gas are repeated. As shown in FIG. 17 which is an enlarged cross-sectional view of the periphery of the trench portion TP shown in FIG. 16, a wider portion and a narrow portion are formed alternately along the depth direction and irregularities called "scallop" are formed on the side surface of the trench portion TP.

Figure 18:
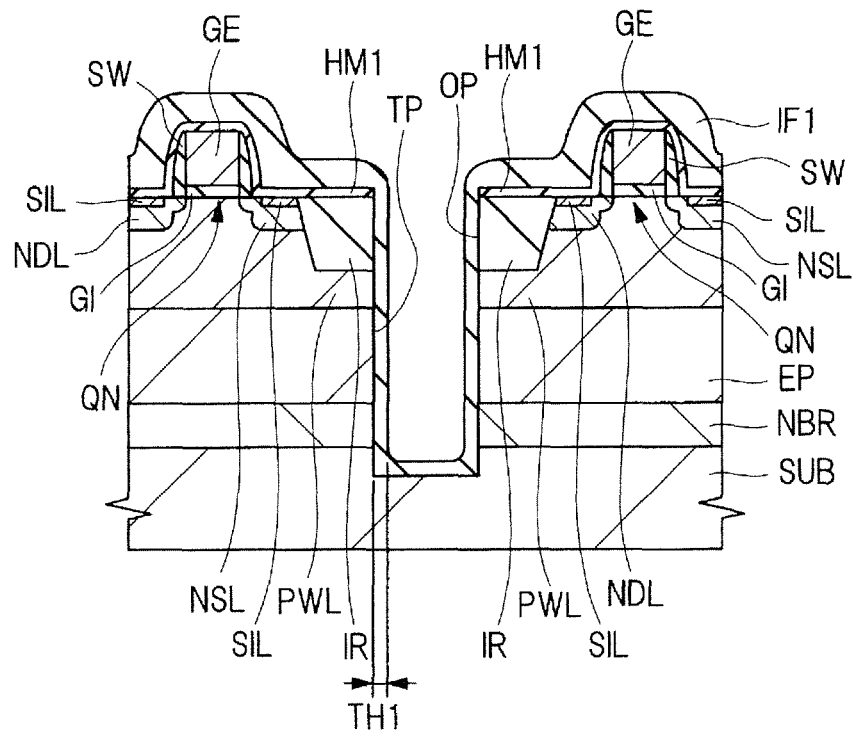
FIG. 18 is a fragmentary cross-sectional view of the semiconductor device according to First Embodiment during a still further manufacturing step thereof.

Next, as shown in FIG. 18, an insulating film IF1 is formed (Step S173 in FIG. 6). In this Step S173, an insulating film IF1 made of a silicon oxide film is formed in the opening portion OP, in the trench portion TP, and on the semiconductor substrate SUB by CVD using a gas containing an ozone ($O_3$) gas and a tetraethoxysilane (TEOS) gas. With this insulating film IF1, the LDMOSFETQH, the p channel MISFETQP, and the n channel MISFETQN as semiconductor elements are covered and also the side surface of the opening portion OP and the side surface of the trench portion TP are covered. The silicon oxide film formed by CVD using a gas containing an $O_3$ gas and a TEOS gas is called "$O_3$TEOS film".

Preferably, the insulating film IF1 made of a silicon oxide film can be formed using sub-atmospheric CVD as the CVD using a gas containing an ozone ($O_3$) gas and a TEOS gas. The pressure employed for forming a film by sub-atmospheric CVD is less than atmospheric pressure which is a pressure employed for forming a film by atmospheric CVD and at the same time, more than the pressure of from about 13 to 390 Pa employed for forming a film by low pressure CVD. The pressure is, for example, more than 390 Pa and less than 0.1 MPa.

This $O_3$TEOS film has both a good step coverage property and good fluidity. The fluidity of a film is described, for example, in M. Matsuura et al., "Film characteristics of APCVD oxide using organic silicon and ozone", Japanese Journal of Applied Physics, Vol. 30, 1991, pp. 1530-1538 while referring to FIG. 9. According to this document, the term "a film has good fluidity" means that, for example, when a corner portion is covered with a certain film, the whole film is planarized due to a decrease in the thickness of a portion of the film covering the corner portion. In addition, as shown in FIG. 9 of the above-mentioned document, a film has better fluidity and the whole film can be planarized when a ratio of the minimum distance between the corner portion and the surface of the film at a position covering the corner portion is smaller than the thickness of the film at a position covering the planar portion.

Figure 19:
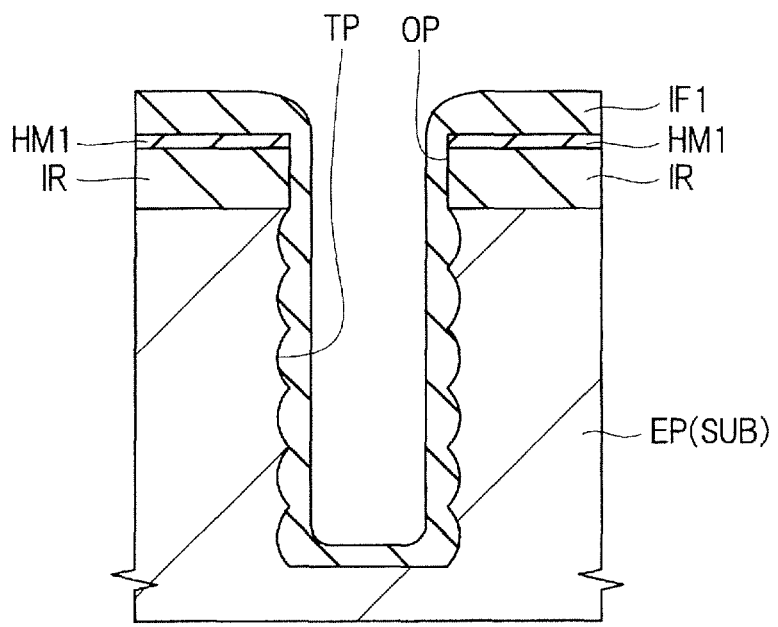
FIG. 19 is a fragmentary cross-sectional view of the semiconductor device according to First Embodiment during a still further manufacturing step thereof.

As shown in FIG. 17, therefore, even when irregularities called "scallop" are formed on the side surface of the trench portion TP, by forming the insulating film IF1 made of an $O_3$TEOS film on the side surface of the trench portion TP, the surface of the insulating film IF1 formed on the side surface of the trench portion TP can be planarized as shown in FIG. 19.

The thickness TH1 of the insulating film IF1 formed on the side surface of the trench portion TP can be set at, for example, 100 nm.

Figure 20:
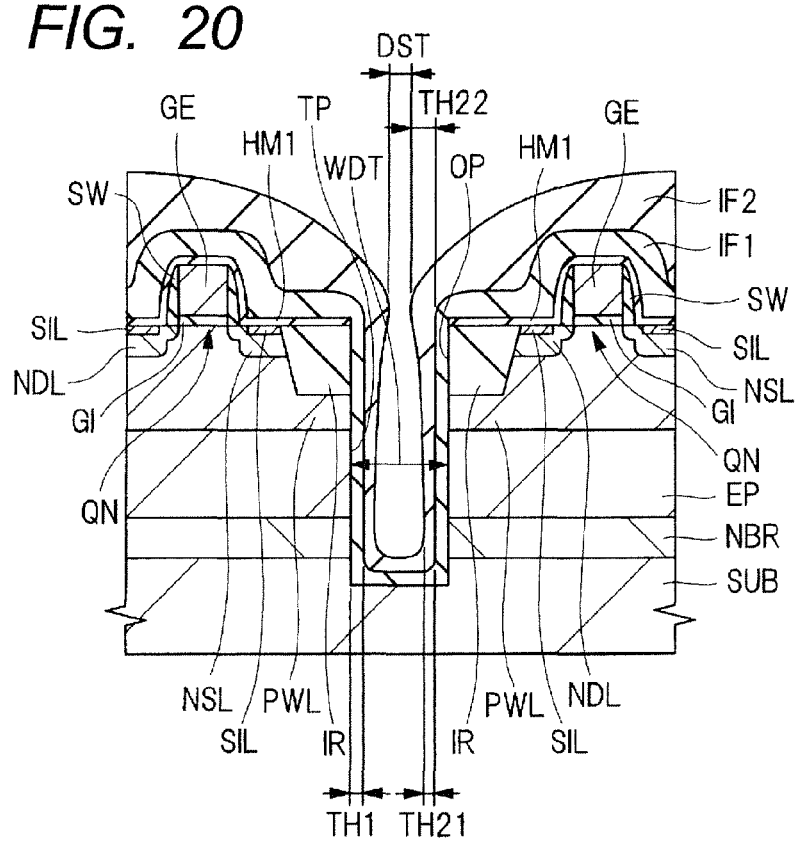
FIG. 20 is a fragmentary cross-sectional view of the semiconductor device according to First Embodiment during a still further manufacturing step thereof.

Next, as shown in FIG. 20, an insulating film IF2 is formed (Step S174 in FIG. 6). The insulating film IF2 formed in this Step S174 is made of a silicon oxide film and formed on the insulating film IF1 by PECVD. With this insulating film IF2, the side surface of the opening portion OP and the side surface of the trench portion TP are covered via the insulating film IF1.

In Step S174, the insulating film IF2 made of a silicon oxide film can be formed, for example, by PECVD using a gas containing a tetraethoxysilane (TEOS) gas. The silicon oxide film formed by PECVD using a gas containing a TEOS gas will hereinafter be called "PTEOS film".

In Step S174, the insulating film IF2 made of a silicon oxide film can also be formed by PECVD using a gas containing a silane ($SiH_4$) gas instead of a TEOS gas. The silicon oxide film formed by PECVD using a gas containing a $SiH_4$ gas will hereinafter be called "P—SiO film".

The step coverage property of each of the PTEOS film and P—SiO film is lower than that of the $O_3$TEOS film and at the same time, the fluidity of each of the PTEOS film and P—SiO film is lower than that of the $O_3$TEOS film. The thicknesses of the insulating film IF2 formed on the side surface of the opening portion OP and that formed on the side surface of the trench portion TP become greater as they get closer to the opening end of the opening portion OP. In other words, the thickness of the insulating film IF2 formed on the side surface of the opening portion OP is greater than the thickness of the insulating film IF2 formed on the side surface of the trench portion TP at the upper portion of the trench portion TP. The thickness of the insulating film IF2 formed on the side surface of the trench portion TP at the upper portion of the trench portion TP is greater than the thickness of the insulating film IF2 formed on the side surface of the trench portion TP at the bottom portion of the trench portion TP. The distances between the insulating films IF2 formed on both side surfaces of the opening portion OP and formed on both side surfaces of the trench portion TP can therefore be made greater as they get closer to the opening end of the opening portion OP. Such an effect is enhanced when the insulating film IF2 is made of the PTEOS film or P—SiO film.

More specifically, as shown in FIG. 20, a thickness TH21 of the insulating film IF2 formed on the side surface of the trench portion TP is smaller than a thickness TH22 of the insulating film IF2 formed on the side surface of the opening portion OP. The distance between the insulating films IF2 formed on both the side surfaces of the trench portion TP can be made greater than the distance DST between the insulating films IF2 formed on both the side surfaces of the opening portion OP.

Preferably, in Step S174, the insulating film IF2 is formed so as not to close the trench portion TP therewith at any position in plan view. With an insulating film IF3 which will be described later referring to FIG. 21, the trench portion TP can therefore be closed.

The thickness TH22 of the insulating film IF2 formed on the side surface of the opening portion OP can be set at, for example, 250 nm. As described above, supposing that the width WDT of the trench portion TP is set at, for example, 1 μm and the thickness TH1 of the insulating film IF1 formed on the side surface of the trench portion TP is set at, for example, 100 nm, the distance DST between the insulating films IF2 formed on both the side surfaces of the opening portion OP can be set at, for example, 300 nm.

Figure 21:
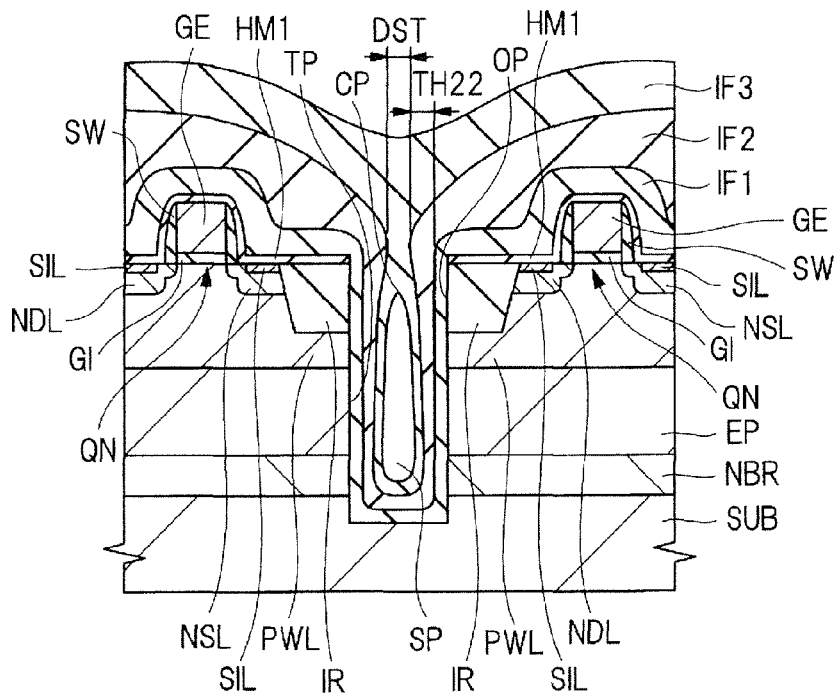
FIG. 21 is a fragmentary cross-sectional view of the semiconductor device according to First Embodiment during a still further manufacturing step thereof.

Next, as shown in FIG. 21, an insulating film IF3 is formed (Step S175 in FIG. 6). The insulating film IF3 formed in this Step S175 is made of a silicon oxide film and it is formed on the insulating film IF2 by CVD using a gas containing an ozone (O$_3$) gas and a tetraethoxysilane (TEOS) gas. With the insulating film IF3, the trench portion TP is closed while leaving a space SP in the trench portion TP.

Preferably, the insulating film IF1 made of a silicon oxide film can be formed by using sub-atmospheric CVD as the CVD using a gas containing an O$_3$ gas and a TEOS gas. The pressure employed for forming a film by sub-atmospheric CVD is less than atmospheric pressure to be employed for forming a film by atmospheric CVD and at the same time, more than a pressure employed for forming a film by low pressure CVD, that is, from about 13 to 390 Pa. It is, for example, more than 390 Pa and less than 0.1 MPa.

The silicon oxide film formed by CVD using a gas containing an O$_3$ gas and a TEOS gas, similar to the insulating film IF1, is called "O$_3$TEOS film" and this O$_3$TEOS film has a good step coverage property and at the same time, has good fluidity. This means that the step coverage property of the O$_3$TEOS film is higher than the step coverage property of each of the PTEOS film and P—SiO film and the fluidity of the O$_3$TEOS film is higher than the fluidity of each of the PTEOS film and the P—SiO film. The thickness of the insulating film IF3 formed on the side surface of the opening portion OP and the thickness of the insulating film IF3 formed on the side surface of the trench portion TP are therefore substantially equal to each other. By forming the insulating film IF3 made of the O$_3$TEOS film on the side surface of the trench portion TP, the trench portion TP can be closed while leaving the space SP in the trench portion TP as shown in FIG. 21.

The upper end position of the space SP left in the trench portion TP will hereinafter be called "closing position CP". By covering, with good planarity, the side surface of the trench portion TP having thereon irregularities such as scallop with the insulating film IF1 and closing the trench portion TP with the insulating films IF2 and IF3, the space SP can be left definitely in the trench portion TP. As will be described later referring to FIG. 25, the space SP can be left easily in the trench portion TP by adjusting the thickness TH22 of the insulating film IF2 formed on the side surface of the opening portion OP and thereby lowering the closing position CP to the desired position.

The thickness of the insulating film IF3 formed on the planar portion of the surface of the insulating film IF2 can be set at, for example, 700 nm.

Figure 22:
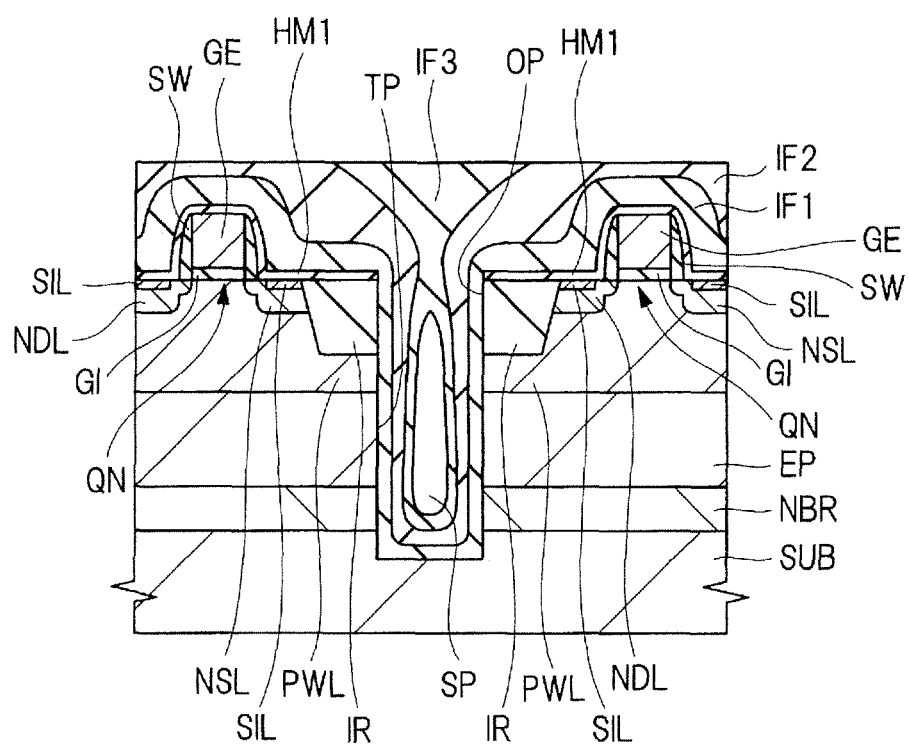
FIG. 22 is a fragmentary cross-sectional view of the semiconductor device according to First Embodiment during a still further manufacturing step thereof.
Figure 23:
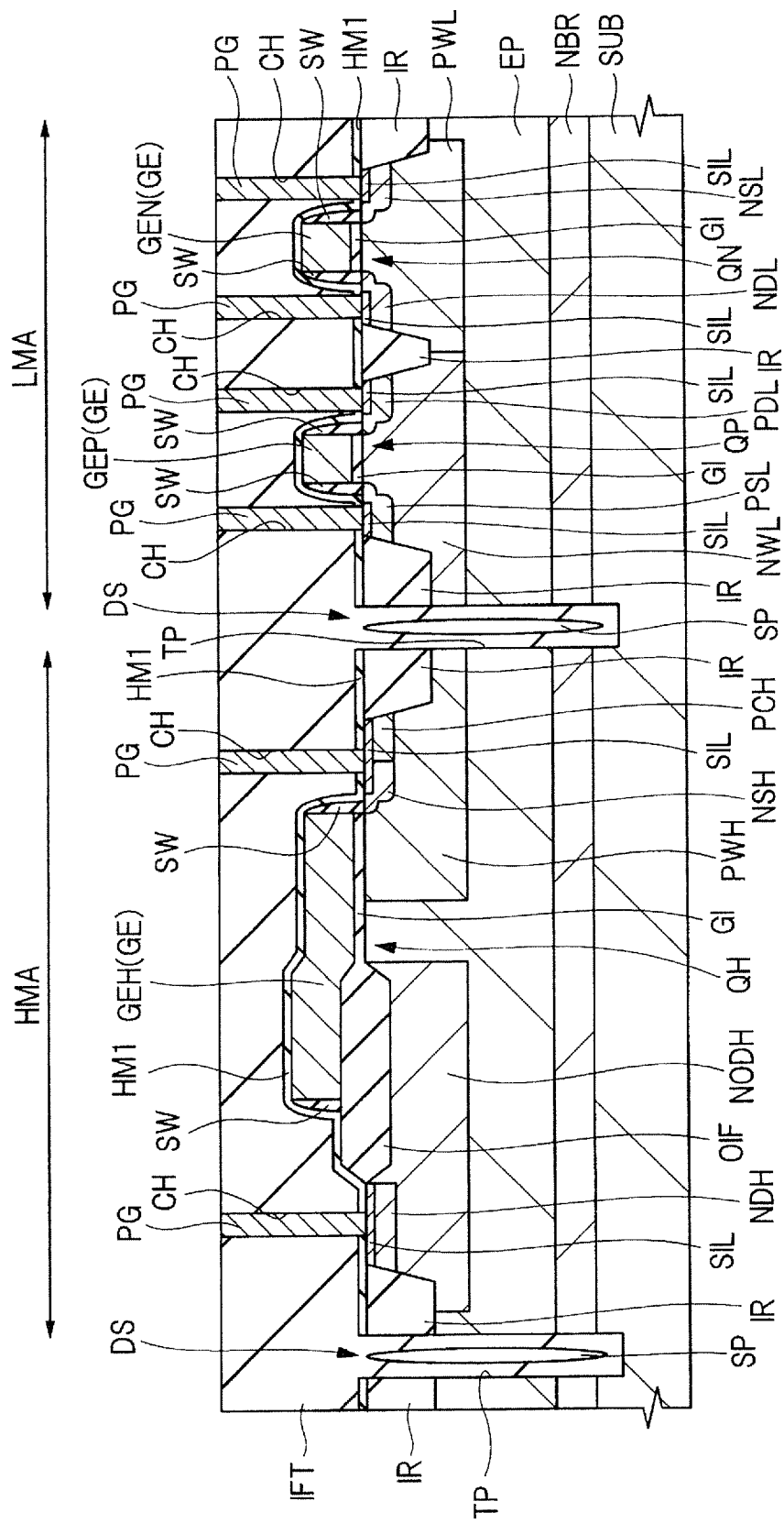
FIG. 23 is a fragmentary cross-sectional view of the semiconductor device according to First Embodiment during a still further manufacturing step thereof.

Next, as shown in FIG. 22, the insulating film IF3 is planarized (Step S176 in FIG. 6). In this Step S176, the surface of the insulating film IF3 is planarized by polishing the insulating film IF3 by CMP or the like. FIG. 22 shows an example of polishing the insulating film IF3 and the insulating film IF2 and thereby planarizing the surfaces of the insulating film IF3 and the insulating film IF2.

Next, an insulating film IF4 is formed (Step S177 in FIG. 6). The insulating film IF4 formed in this Step S177 is made of a silicon oxide film and it is formed by PECVD. As shown in FIG. 4, the insulating film IF4 is formed on the insulating film IF3. As a result, formation of the insulating film IFT comprised of the insulating films IF1, IF2, IF3, and IF4 is completed.

For example, in Step S177, the insulating film IF4 made of a silicon oxide film can be formed by PECVD using a gas containing a tetraethoxysilane (TEOS) gas. Similar to the insulating film IF2, the silicon oxide film formed by PECVD using a gas containing a TEOS gas will hereinafter be called "PTEOS film".

Alternatively, the insulating film IF4 made of a silicon oxide film can be formed by PECVD using a gas containing a silane (SiH$_4$) as instead of a TEOS gas. Similar to the insulating film IF2, the silicon oxide film formed by PECVD using a gas containing SiH$_4$ gas will hereinafter be called "P—SiO film".

When the trench portion TP is closed with the insulating film IF3, a joint also called seam may be formed at the center portion of the insulating film IF3 located at the upper portion of the trench portion TP. In a later step when wet etching is performed with an etching liquid, there is a possibility of this etching liquid penetrating through this joint.

On the other hand, the insulating film IF4 formed on the insulating film IF3 can cover the joint formed in the insulating film IF3 located at the upper portion of the trench portion TP. When wet etching is performed using an etching liquid in a later step, this makes it possible to prevent or suppress the etching liquid from penetrating through this joint. Such an effect is enhanced when the insulating film IF4 is made of the PTEOS film or P—SiO film.

The thickness of the insulating film IF4 can be set at, for example, 100 nm.

In such a manner, the DTI structure can be formed as shown in FIG. 13. When there is no possibility of the etching liquid penetrating through the joint of the insulating film IF3, Step S177 for the formation of the insulating film IF4 may be omitted.

In the description referring to FIG. 13 and the following description, in order to facilitate understanding, the insulating films IF1, IF2, IF3, and IF4 may be described collectively as the insulating film IFT.

Next, as shown in FIG. 23, a plug PG is formed (Step S18 in FIG. 5). The plug PG formed in Step S18 penetrates through the insulating film IFT and the insulating film HM1 and reaches each of the $n^+$ type source region NSH, $n^+$ type drain region NDH, $p^+$ type contact region PCH, $p^+$ type source region PSL, $p^+$ type drain region PDL, $n^+$ type source region NSL, and $n^+$ type drain region NDL.

First, with a photoresist pattern (not illustrated) as an etching mask, the insulating film IFT and the insulating film HM1 are dry etched. This dry etching forms a contact hole CH penetrating through the insulating film IFT and the insulating film HM1 and reaching each of the $n^+$ type source region NSH, $n^+$ type drain region NDH, $p^+$ type contact region PCH, $p^+$ type source region PSL, $p^+$ type drain region PDL, $n^+$ type source region NSL, and $n^+$ type drain region NDL.

Next, the plug PG is formed in the contact hole CH. For example, after formation of a barrier film made of a titanium nitride film on the insulating film IFT and also in the contact hole CH by CVD, a conductor film made of a tungsten film is formed on the barrier film by CVD so as to fill the contact hole CH with the conductor film. Then, unnecessary portions of the conductor film and barrier film on the insulating film IFT are removed by CMP or etch-back. As a result, the plug PG containing the conductor film, for example, made of a tungsten film is formed in the contact hole CH.

Next, a first-layer wiring M1 composed mainly of, for example, an aluminum (Al) alloy film is formed on the insulating film IFT. The wiring M1 is electrically coupled to the plug PG in the contact hole CH. Then, an interlayer insulating film IL1 made of, for example, a silicon oxide film is formed on the insulating film IFT and also on the first-layer wiring M1 and a plug PG1 penetrating through the interlayer insulating film IL1 and reaching the wiring M1 is formed.

Next, a second-layer wiring M2 composed mainly of, for example, an Al alloy film is formed on the interlayer insulating film IL1. The wiring M2 is electrically coupled to the plug PG1 penetrating through the interlayer insulating film IL1. Then, an interlayer insulating film IL2 made of, for example, a silicon oxide film is formed on the interlayer insulating film IL1 and also on the second-layer wiring M2 and a plug PG2 penetrating through the interlayer insulating film IL2 and reaching the wiring M2 is formed.

Next, a third-layer wiring M3 composed mainly of, for example, an Al alloy film is formed on the interlayer insulating film IL2. The wiring M3 is electrically coupled to the plug PG2 penetrating through the interlayer insulating film IL2. Then, an interlayer insulating film IL3 made of, for example, a silicon oxide film is formed on the interlayer insulating film IL2 and also on the third-layer wiring M3. In such a manner, manufacture of the semiconductor device shown in FIG. 1 is completed.

<Closing Position>

Figure 24:
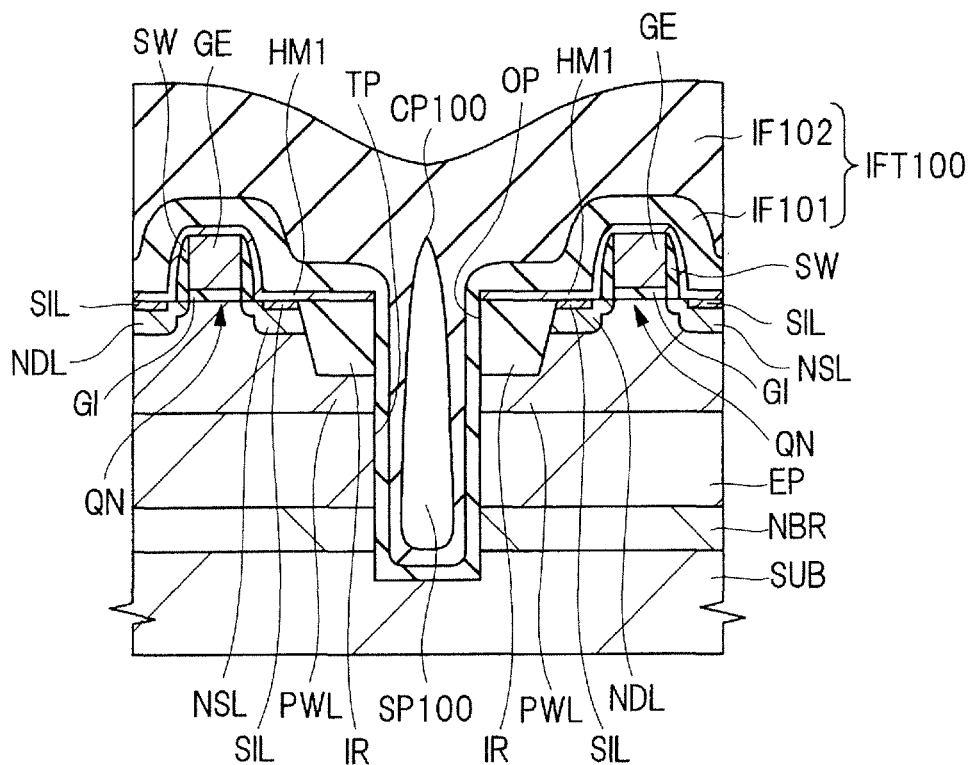
FIG. 24 is a fragmentary cross-sectional view of a semiconductor device of Comparative Example during a manufacturing step thereof.

Next, a closing position of a space upon closing a trench portion while leaving the space in the trench portion will be described in comparison with a method of manufacturing a semiconductor device according to Comparative Example. FIG. 24 is a fragmentary cross-sectional view during a manufacturing step of the semiconductor device of Comparative Example.

In the method of manufacturing a semiconductor device according to Comparative Example, an insulating film IFT 100 made of insulating films IF101 and IF102 is formed in a trench portion TP. The insulating film IF101 is made of a silicon oxide film formed by CVD using a gas containing a TEOS (BP-TEOS) gas added with boron (B) and phosphorus (P) and it is also called "BPSG (boro-phosphate silicate glass) film". The insulating film IF102 is made of a silicon oxide film formed by PECVD.

In the method of manufacturing a semiconductor device according to Comparative Example, after formation of the trench portion TP by Step S172 in FIG. 6 in the method of manufacturing a semiconductor device according to First Embodiment, an insulating film IF101 made of a silicon oxide film is formed by CVD using a gas containing a BP-TEOS gas. Then, an insulating film IF102 made of a silicon oxide film is formed by PECVD. The trench portion TP is closed with the insulating film IF102 while leaving a space SP100 in the trench portion TP.

The BPSG film does not have a good step coverage property and at the same time, the BPSG film does not have good fluidity. Therefore, when the trench portion TP has, on the side surface thereof, irregularities called scallop, the depth of the irregularities on the surface of the insulating film IF1 formed on the side surface of the trench portion TP cannot be reduced, making it impossible to planarize the surface of the insulating film IF1.

On the other hand, the PTEOS film does not have a good step coverage property and at the same time, the PTEOS film does not have good fluidity. In this case, the thickness of the insulating film IF102 formed on the side surface of the opening portion OP and the side surface of the trench portion TP becomes greater as they get closer to the opening end of the opening portion OP. In other words, the thickness of the insulating film IF102 formed on the side surface of the opening portion OP is greater than the thickness of the insulating film IF102 formed on the side surface of the trench portion TP at an upper portion of the trench portion TP. The thickness of the insulating film IF102 formed on the side surface of the trench portion TP at an upper portion of the trench portion TP is greater than the thickness of the insulating film IF102 formed on the side surface of the trench portion TP at a bottom portion of the trench portion TP. Although the trench portion TP can be closed with the insulating film IF102 formed on the side surface of the trench portion TP while leaving a space SP100 in the trench portion TP, the closing position CP100 of the space SP100 may be higher than the desired position.

When the closing position CP100 of the space SP100 becomes higher than the desired position, there is the possibility that after formation of the insulating film IF102, planarizing the surface of the insulating film IF102, for example, by polishing the insulating film IF102 makes the surface height position of the insulating film IF102 lower than the closing position CP100 of the space SP100 and the space SP100 is exposed from the surface of the insulating film IF102. This may cause penetration of a polishing slurry into the space SP100 or penetration of a washing liquid through the space SP100 during a washing step performed later. The slurry or washing liquid penetrated in the space SP100 bursts from the space SP100, thereby generating foreign matters. As a result, defects in the shape of the semiconductor device may occur, resulting in deterioration in the performance of the semiconductor device.

In addition, an increase in the surface height position of the insulating film IF102 after planarization of the surface of the insulating film IF102 leads to an increase in an aspect ratio, that is, a depth-to-width ratio of the contact hole CH (refer to FIG. 23) penetrating through the insulating film IF102, insulating film IF101, and insulating film HM1 and reaching, for example, the $n^+$ type source region NSL. This makes it difficult to form the contact hole CH and the plug PG (refer to FIG.

23) with good shape accuracy. As a result, the semiconductor device thus obtained may have deteriorated performance.

When the insulating film TF101 made of a BPSG film is formed, on the other hand, boron (B) or phosphorus (P) may diffuse from the BPSG film into the p⁻ type epitaxial layer EP or the like. Due to this diffusion, the threshold voltage of the LDMOSFETQH, p channel MISFETQP, or channel MISFETQN may fluctuate and cause deterioration in the characteristics of the transistor.

<Major Characteristics and Advantages of First Embodiment>

In the method of manufacturing a semiconductor device according to First Embodiment, on the other hand, after formation of a trench portion TP, an insulating film IF1 made of a silicon oxide film is formed by CVD using a gas containing an $O_3$ gas and a TEOS gas and the side surface of the trench portion TP is covered with the insulating film IF1. Then, an insulating film IF2 made of a silicon oxide film is formed by PECVD. With the insulating film IF2, the side surface of the trench portion TP is covered via the insulating film IF1. Then, an insulating film IF3 made of a silicon oxide film is formed by CVD using a gas containing an $O_3$ gas and a TEOS gas. The trench portion TP is closed with the insulating film IF3 while leaving a space SP in the trench portion TP.

The $O_3$TEOS film contained in the insulating film IF1 has a good step coverage property and at the same time, has good fluidity. Even when the trench portion TP has, on the side surface thereof, irregularities called scallop, the surface of the insulating film IF1 can be planarized.

On the other hand, the step coverage property of each of the PTEOS film and P—SiO film contained in the insulating film IF2 is lower than that of the $O_3$TEOS film and at the same time, the fluidity of each of the PTEOS film and P—SiO film contained in the insulating film IF2 is lower than that of the $O_3$TEOS film. The thickness of the insulating film IF2 formed on the side surface of the opening portion OP and the side surface of the trench portion TP becomes greater as they get closer to the opening end of the opening portion OP. In other words, the thickness of the insulating film IF2 formed on the side surface of the opening portion OP is greater than the thickness of the insulating film IF2 formed on the side surface of the trench portion TP at an upper portion of the trench portion TP, while the thickness of the insulating film IF2 formed on the side surface of the trench portion TP at an upper portion of the trench portion TP is greater than the thickness of the insulating film IF2 formed on the side surface of the trench portion TP at the bottom portion of the trench portion TP.

The distance between the insulating films IF2 formed on both the side surfaces of the opening portion OP and on both the side surfaces of the trench portion TP can be made greater as they get close to the opening end of the opening portion OP. In other words, the distance between the insulating films IF2 formed on both the side surfaces of the opening portion OP can be made greater than the distance between the insulating films IF2 formed on both the side surfaces of the trench portion TP at an upper portion of the trench portion TP. Further, the distance between the insulating films IF2 formed on both the side surfaces of the trench portion TP at an upper portion of the trench portion TP can be made greater than the distance between the insulating films IF2 formed on both the side surfaces of the trench portion TP at a bottom portion of the trench portion TP.

The $O_3$TEOS film contained in the insulating film IF3 has a good step coverage property and at the same time, has good fluidity. The thickness of the insulating film IF3 formed on the side surface of the opening portion OP, the thickness of the insulating film IF3 formed on the side surface of the trench portion TP at an upper portion of the trench portion TP, and the thickness of the insulating film IF3 formed on the side surface of the trench portion TP at a bottom portion of the trench portion TP are substantially equal to one another. The trench portion TP can therefore be closed while leaving the space SP in the trench portion TP.

Figure 25:
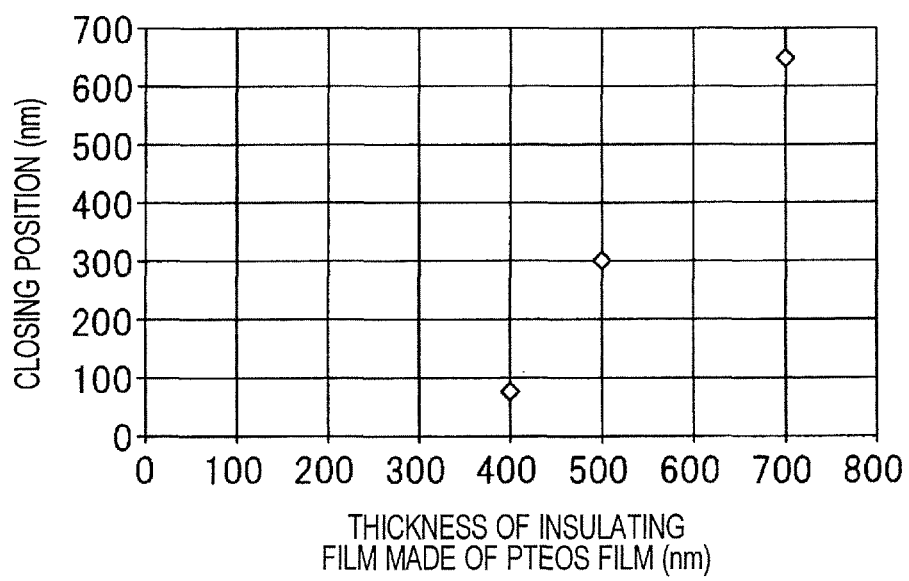
FIG. 25 is a graph showing the relationship between the thickness of an insulating film made of a PTEOS film and a closing position.

FIG. 25 is a graph showing the relationship between the thickness of the insulating film IF2 made of a PTEOS film and the closing position. The thickness of the insulating film IF2 made of a PTEOS film is plotted along the abscissa of FIG. 25, while the closing position is plotted along the ordinate of FIG. 25. The thickness of the insulating film IF2 made of a PTEOS film means a thickness TH22 (refer to FIG. 21) of the insulating fil IF2 formed on the side surface of the opening portion OP. FIG. 25 shows the relationship between the thickness of the insulating film IF2 made of a PTEOS film and the closing position supposing that the depth DPT of the trench portion TP is set at 15 μm, the width WDT of the trench portion TP is set at 1 μm, and the thickness TH1 of the insulating film IF1 formed on the side surface of the trench portion TP is set at 100 nm. Further, the ordinate of FIG. 25 means a height of the closing position CP from the interface between the element isolation region IR, as an insulating film made of a silicon oxide film, and the p⁻ type epitaxial layer EP including n⁺ type drain region NDL.

As is apparent from FIG. 25 that the closing position CP lowers with a decrease in the thickness of the insulating film IF2, that is, an increase in the distance DST (refer to FIG. 21) between the insulating films IF2 formed on both the side surfaces of the opening portion OP. Since an increase in the distance DST between the insulating films IF2 formed on both the side surfaces of the opening portion OP interferes with closing of the trench portion TP, the closing position CP lowers. According to First Embodiment, therefore, the space SP can be left easily in the trench portion TP by adjusting the thickness of the insulating film IF2 so as to lower the closing position CP to a desired position.

When the trench portion TP is closed only with the insulating films IF1 and IF3 each made of an $O_3$TEOS film having good fluidity without forming the insulating film IF2, the trench portion TP can be filled with the $O_3$TEOS film while leaving the space SP in the trench portion TP, but the closing position CP of the space SP cannot easily be lowered.

In First Embodiment, on the other hand, an insulating film IF1 made of an $O_3$TEOS film and having good fluidity is formed; an insulating film IF2 made of a PTEOS film and having fluidity lower than that of the $O_3$TEOS film is formed on the insulating film IF1; and an insulating film IF3 made of an $O_3$TEOS film and having fluidity higher than that of the PTEOS film is formed on the insulating film IF2. This facilitates lowering of the closing position CP of the space SP upon closing the trench portion TP while leaving the space SP in the trench portion TP.

Thus, according to First Embodiment, the closing position CP of the space SP can be easily lowered to a desired position. It is therefore possible to prevent or suppress the surface height position of the insulating film IF3 from becoming lower than the closing position CP of the space SP upon planarizing the surface of the insulating film IF3, for example, by polishing the insulating film IF3. Further, it is possible to prevent or suppress a polishing slurry from entering the space SP exposed from the surface of the insulating film IF3 and prevent or suppress a washing liquid from entering the space SP in a subsequent washing step. Accordingly, it is possible to prevent or suppress the slurry or washing liquid that has entered the space SP from bursting from the space SP and thereby generating foreign matters and prevent or suppress generation of defects in the shape of the semiconductor device. As a result, the semiconductor device can have improved performance.

In addition, the surface height position of the insulating film IF3 after planarization of the surface of the insulating film IF3 lowers so that an aspect ratio, that is, a depth-to-width ratio of the contact hole CH (refer to FIG. 23) penetrating through the insulating film IFT and the insulating film HM1 and reaching, for example, the $n^+$ type source region NSL can be reduced. The contact hole CH and the plug PG (refer to FIG. 23) can therefore be formed with shape accuracy and as a result, the semiconductor device thus obtained has improved performance.

In First Embodiment, different from Comparative Example, since the insulating film IF101 made of a BPSG film is not formed so that there is no possibility of boron (B) or phosphorus (P) diffusing into the $p^-$ type epitaxial layer from the BPSG film. Deterioration in transistor characteristics due to variation in threshold voltage of, for example, LDMOSFETQH, p channel type MISFETQP, and n channel type MISFETQN can therefore be prevented or suppressed.

The space SP formed in the trench portion TP can reduce a leakage current of the elements separated by the DTI structure DS, increase a breakdown voltage, and relax an electric field intensity at a position contiguous to the trench portion TP.

Further, the space SP formed in the trench portion TP can suppress the electric field from acting on an adjacent element and thereby disturbing the elongation of a depletion layer, in other words, can suppress a reverse field plate effect. This results in enhancement of a separation breakdown voltage. In addition, the space SP formed in the trench portion TP can reduce the stress in the trench portion TP and therefore can suppress generation of crystal defects due to the stress.

The DTI structure DS formed in the element isolation region IR can relax the stress concentration at the upper portion of the trench portion TP. Generation of crystal defects can therefore be suppressed further.

Second Embodiment

In the method of manufacturing a semiconductor device according to First Embodiment, after formation of a trench portion communicated with an opening portion and reaching the middle of the semiconductor substrate in the thickness direction, an insulating film is formed in the trench portion and with this insulating film, the trench portion is closed while leaving a space in the trench portion. In addition, a method of manufacturing a semiconductor device according to Second Embodiment, before formation of the insulating film but after the formation of the trench portion, the side surface of the opening portion is retreated from the side surface of the trench portion.

The configuration of the semiconductor device according to Second Embodiment is similar to the configuration of the semiconductor device of First Embodiment so that an overlapping description is omitted.

<Method of Manufacturing Semiconductor Device>

Next, the method of manufacturing a semiconductor device according to Second Embodiment will be described. FIGS. 26 to 38 are fragmentary cross-sectional views during a manufacturing step of the semiconductor device according to Second Embodiment. FIGS. 26 to 38 are enlarged cross-sectional views showing the configuration around a DTI structure.

In FIGS. 29 to 31, 34, and 38, in order to facilitate understanding, the DTI structure having on both sides thereof an MISFET are shown. As shown in FIG. 3 in First Embodiment, however, the DTI structure DS may be formed between an LDMOSFETQH and a p channel MISFETQP or between other various elements.

In Second Embodiment, steps similar to those (Steps S11 to S16 in FIG. 5) described referring to FIGS. 7 to 12 in First Embodiment are performed to form an insulating film HM1 and an insulating film HM2.

Next, also in Second Embodiment, steps (Steps 171 and 172 in FIG. 6) described referring to FIGS. 14 and 15 in First Embodiment are performed and a semiconductor substrate SUB made of, for example, single crystal silicon (Si) is dry etched to form a trench portion TP.

Figure 26:
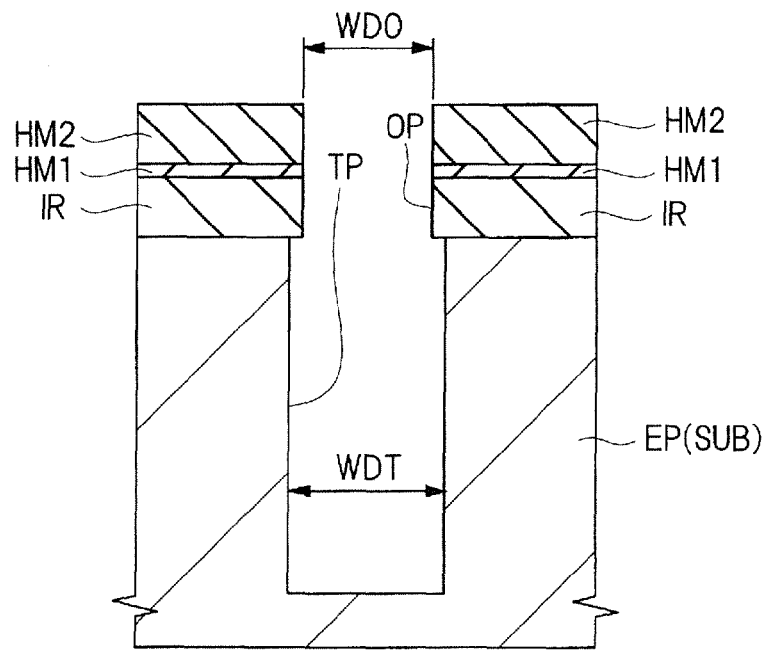
FIG. 26 is a fragmentary cross-sectional view of a semiconductor device according to Second Embodiment during a manufacturing step thereof.

When the trench portion TP is formed, silicon of a portion exposed from the side surface of the trench portion TP is etched and the side surface of the trench portion TP may be retreated from the side surface of the opening portion OP as shown in FIG. 26. In such a case, the width WDO of the opening portion OP may become smaller than the width WDT of the trench portion TP, which may rise the closing position CP (refer to FIG. 31 described later) of the space SP.

In Second Embodiment, therefore, wet etching, for example, with hydrofluoric acid (HF) is performed after formation of the trench portion TP. The insulating film HM2 made of a silicon oxide film is removed by this wet etching. In addition, respective portions of the insulating film HM1 and the element isolation region IR exposed from the side surface of the opening portion OP are removed by etching.

Figure 27:
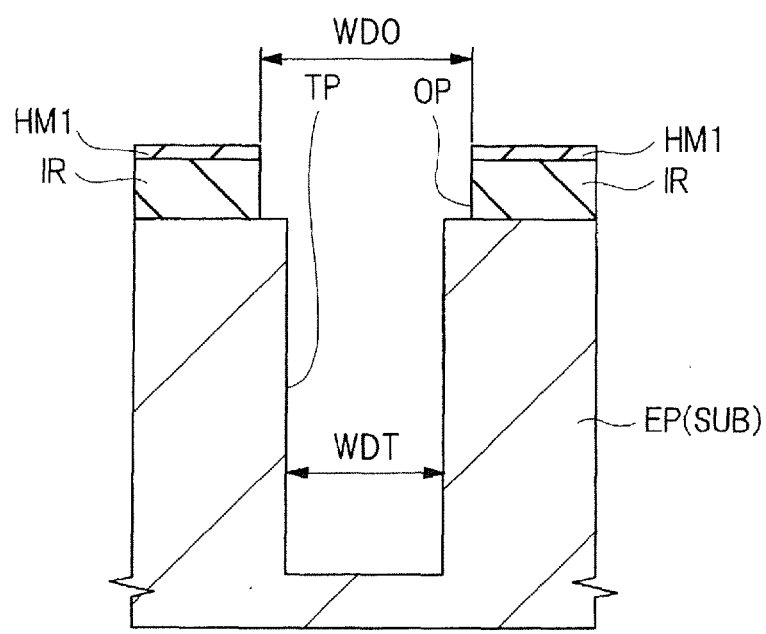
FIG. 27 is a fragmentary cross-sectional view of the semiconductor device according to Second Embodiment during another manufacturing step thereof.

By the above-mentioned etching, as shown in FIG. 27, the side surface of a portion of the insulating film HM1 exposed from the side surface of the opening portion OP and the side surface of a portion of the element isolation region IR as an insulating film exposed from the side surface of the opening portion OP are retreated from the side surface of the trench portion TP. In other words, the side surface of the opening portion OP is retreated from the side surface of the trench portion TP. As a result, the width WDO of the opening portion OP becomes greater than the width WDT of the trench portion TP. This means that the width WDT of the trench portion TP becomes smaller than the width WDO of the opening portion OP. Here, the closing position CP of the space SP is influenced by the trench portion TP having a smaller width than that of the opening portion OP. This therefore enables lowering of the closing position CP (refer to FIG. 31 described later) of the space SP.

As a first modification example of this method of retreating the side surface of the opening portion OP from the side surface of the trench portion TP, the following method can be carried out.

Figure 28:
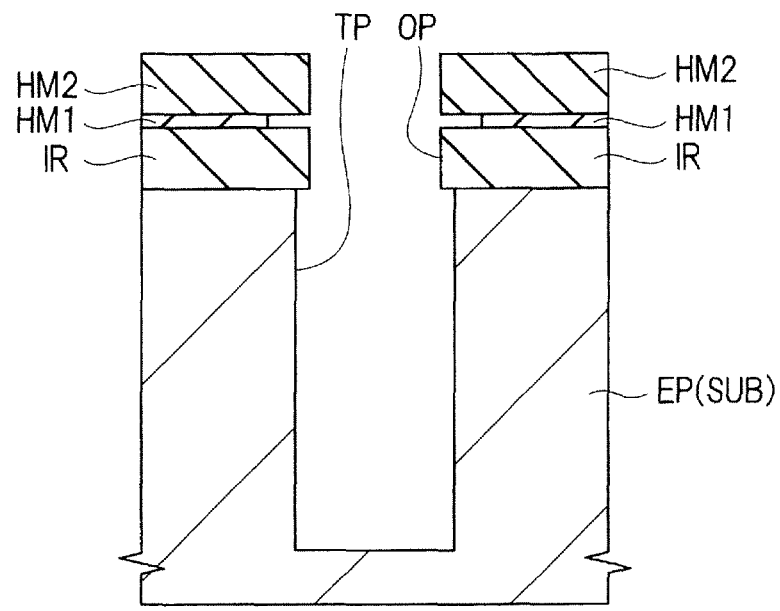
FIG. 28 is a fragmentary cross-sectional view of the semiconductor device according to Second Embodiment during a further manufacturing step thereof.

In the present first modification example, formation of the trench portion TP is followed by either one or both of isotropic dry etching using, for example, a gas containing an oxygen ($O_2$) gas and a trifluoromethane ($CHF_3$) gas and wet etching with hot phosphoric acid. By this treatment, as shown in FIG. 28, the side surface of a portion of the insulating film HM1 made of a silicon nitride film exposed from the side surface of the opening portion OP is retreated from the side surface of the trench portion TP.

Next, wet etching, for example, with hydrofluoric acid (HF) is performed. As shown in FIG. 27, the insulating film HM2 made of a silicon oxide film is removed by this etching. Further, a portion of the element isolation region IR made of a silicon oxide film and exposed from the side surface of the opening portion OP is etched to retreat the side surface of the element isolation region IR from the side surface of the trench portion TP. Since a portion of the side surface of the insulating film HM1 exposed from the side surface of the opening portion OP is retreated from the side surface of the trench portion TP in advance, it is possible to prevent or suppress an end portion of the insulating film HM1 from protruding in the shape of eaves from the surface of the element isolation region IR.

Figure 29:
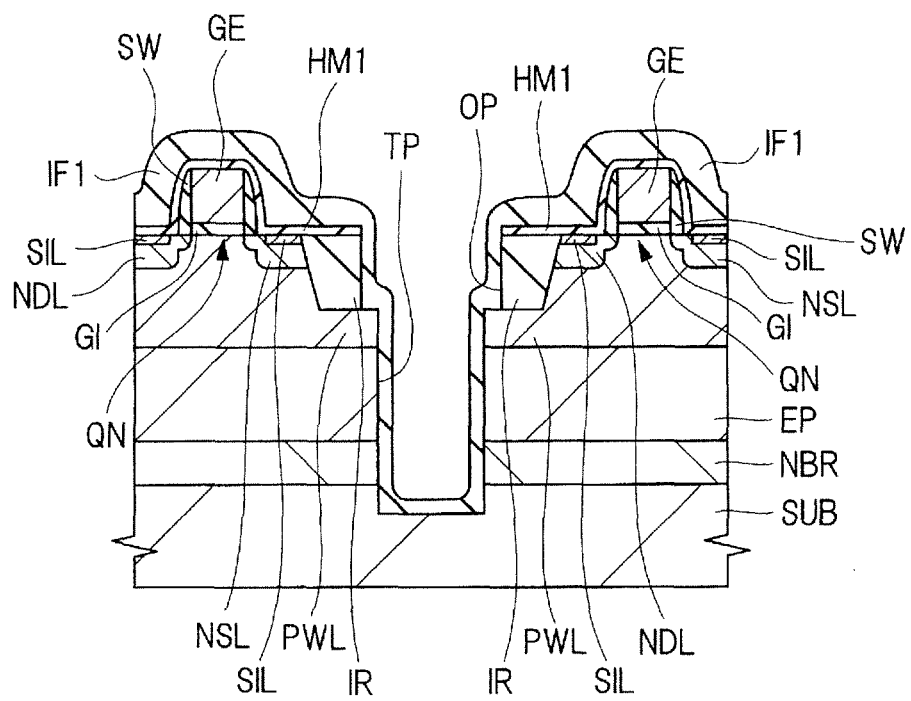
FIG. 29 is a fragmentary cross-sectional view of the semiconductor device according to Second Embodiment during a still further manufacturing step thereof.
Figure 30:
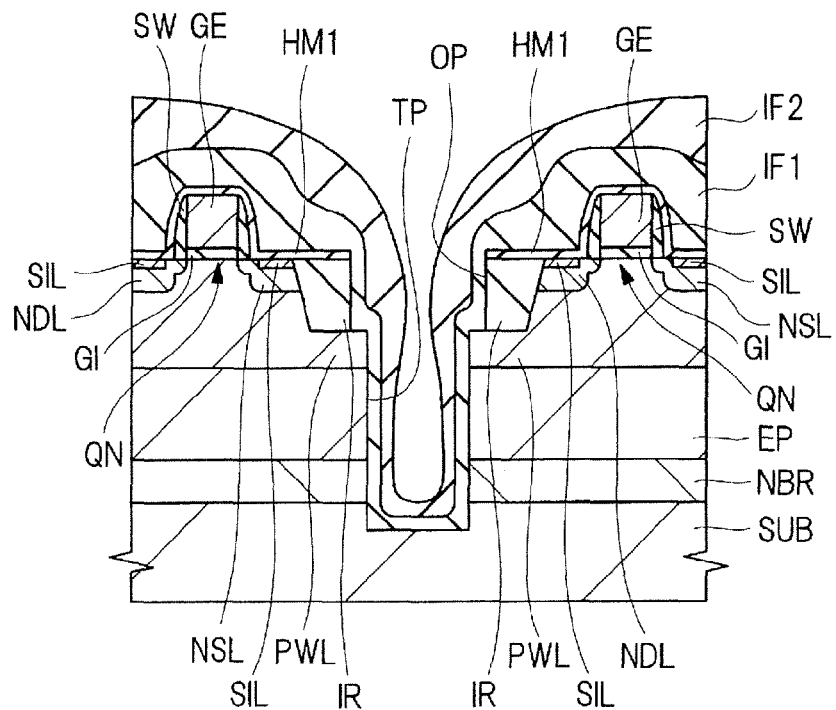
FIG. 30 is a fragmentary cross-sectional view of the semiconductor device according to Second Embodiment during a still further manufacturing step thereof.
Figure 31:
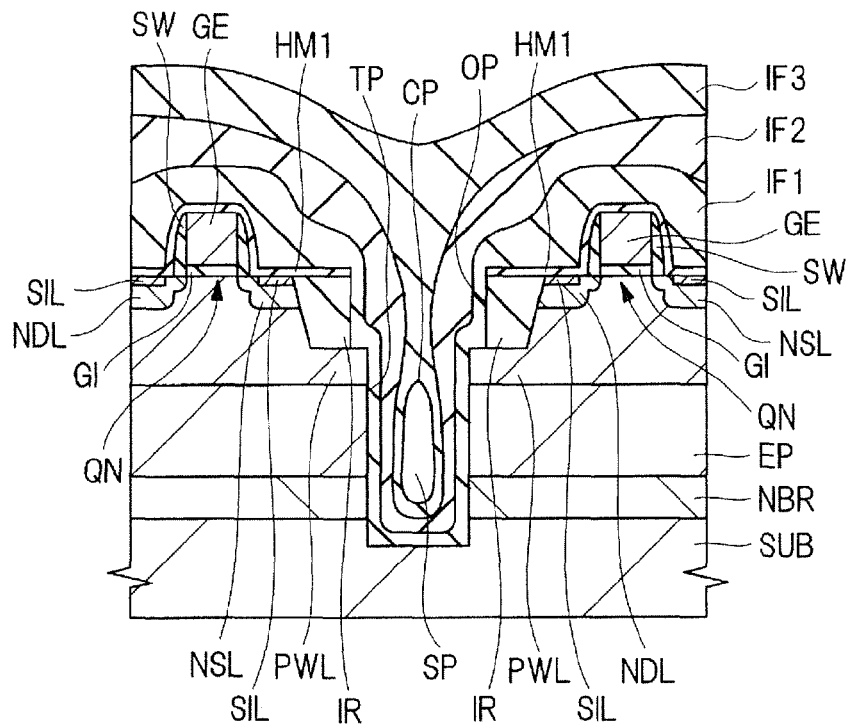
FIG. 31 is a fragmentary cross-sectional view of the semiconductor device according to Second Embodiment during a still further manufacturing step thereof.

In Second Embodiment and the present first modification example, a step similar to that (Step S173 in FIG. 6) described referring to FIG. 18 in First Embodiment is next performed to form an insulating film IF1 and with this insulating film IF1, the side surface of the opening portion OP and the side surface of the trench portion TP are covered as shown in FIG. 29. Then, a step similar to that (Step S174 in FIG. 6) described referring to FIG. 20 in First Embodiment is performed to form an insulating film IF2 and with this insulating film IF2, the side surface of the opening portion OP and the side surface of the trench portion TP are covered via the insulating film IF1 as shown in FIG. 30. Further, a step similar to that (Step S175 in FIG. 6) described referring to FIG. 21 in First Embodiment is performed to form an insulating film IF3 and with this insulating film IF3, the trench portion TP is closed while leaving a space SP in the trench portion TP, as shown in FIG. 31.

In Second Embodiment and the present first modification example, since the side surface of the opening portion OP retreats from the side surface of the trench portion TP, a distance between the insulating films IF2 formed on both the side surfaces of the opening portion OP can be increased and the closing position CP of the space SP can easily be lowered.

Then, steps (Step S176 and Step S177 in FIG. 6 and Step S18 in FIG. 5) described referring to FIGS. 22, 4, and 23 in First Embodiment and steps subsequent thereto are performed to complete the manufacture of the semiconductor device of Second Embodiment.

As a second modification example of the method of retreating the side surface of the opening portion OP from the side surface of the trench portion TP, the following method can be used.

Figure 32:
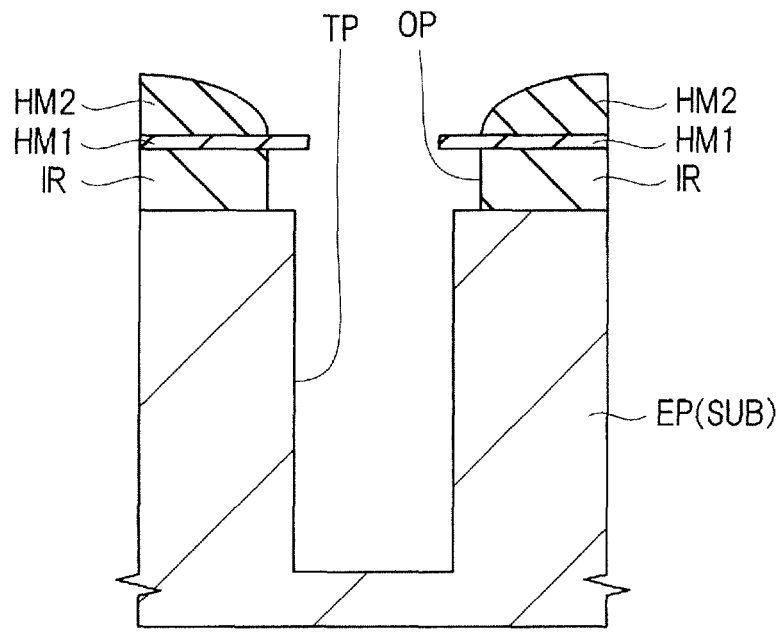
FIG. 32 is a fragmentary cross-sectional view of the semiconductor device according to Second Embodiment during a still further manufacturing step thereof.

In the present second modification example, formation of the trench portion TP is followed by wet etching, for example, with hydrofluoric acid (HF). At this time, the insulating film HM2 made of a silicon oxide film is not removed completely but partially to retreat an end portion of the insulating film HM2 made of a silicon oxide film and exposed from the side surface of the opening portion OP from the side surface of the trench portion TP as shown in FIG. 32. Further, a portion of the element isolation region IR made of a silicon oxide film and exposed from the side surface of the opening portion OP is etched to retreat the side surface of the element isolation region IR from the side surface of the trench portion TP.

Figure 33:
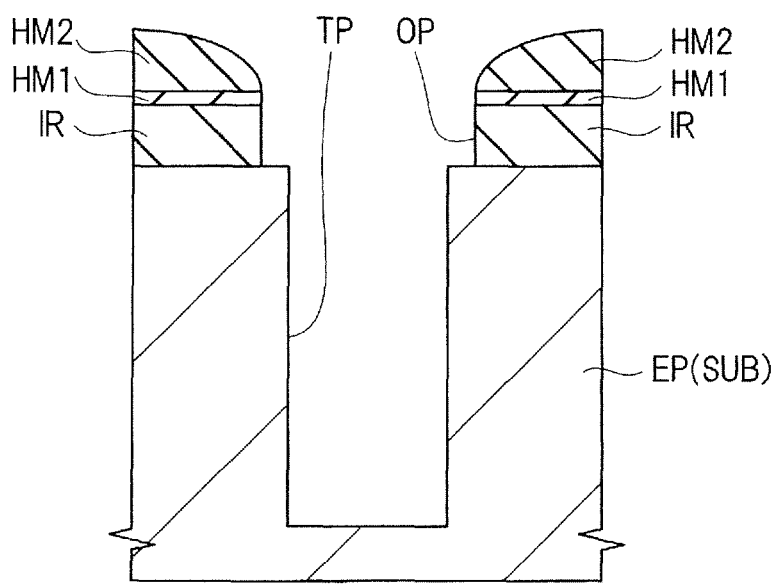
FIG. 33 is a fragmentary cross-sectional view of the semiconductor device according to Second Embodiment during a still further manufacturing step thereof.

Next, anisotropic dry etching is performed to remove a portion of the insulating film HM1 made of a silicon oxide film protruded from both the retreated end portion of the insulating film HM2 and the retreated side surface of the element isolation region IR. As a result, as shown in FIG. 33, a portion of the insulating film HM1 made of a silicon nitride film and not sandwiched perpendicularly between the insulating film HM2 and the element isolation region IR is removed and the side surface of the insulating film HM1 is retreated from the side surface of the trench portion TP.

Figure 34:
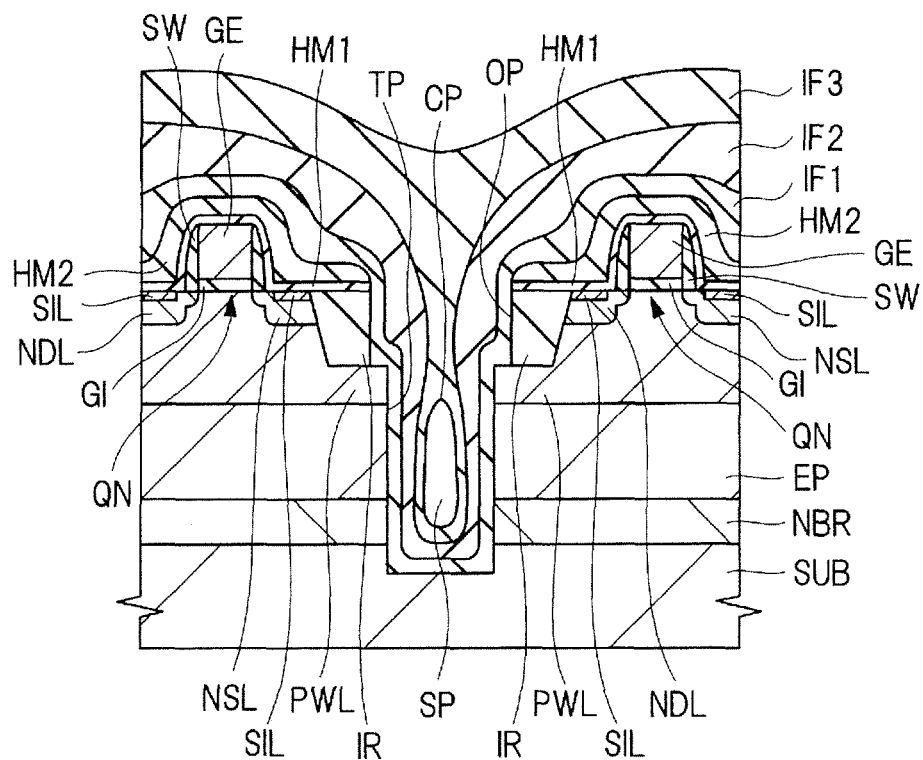
FIG. 34 is a fragmentary cross-sectional view of the semiconductor device according to Second Embodiment during a still further manufacturing step thereof.

In the second modification example of Second Embodiment, steps similar to those (Step S173 to Step S175 in FIG. 6) described referring to FIGS. 18, 20, and 21 in First Embodiment are performed. By these steps, as shown in FIG. 34, the side surface of the opening portion OP and the side surface of the trench portion TP are covered with an insulating film IF1, the side surface of the opening portion OP and the side surface of the trench portion TP are covered with an insulating film IF2 via the insulating film IF1, and the trench portion TP is closed with an insulating film IF3 while leaving a space SP in the trench portion TP.

In the present second modification example, since the side surface of the opening portion OP retreats from the side surface of the trench portion TP, the distance between the insulating films IF2 formed on both the side surfaces of the opening portion OP can be increased, facilitating lowering of the closing position CP of the space SP.

The present second modification example is however different from Second Embodiment that the insulating film HM2 remains between the insulating film HM1 and the insulating film IF1.

Then, steps (Step S176 and Step S177 in FIG. 6 and Step S18 in FIG. 5) described referring to FIGS. 22, 4, and 23 in First Embodiment and steps subsequent thereto are performed to complete the manufacture of the semiconductor device of Second Embodiment.

As a third modification example of the method of retreating the side surface of the opening portion OP from the side surface of the trench portion TP, the following method can also be performed instead.

Figure 35:
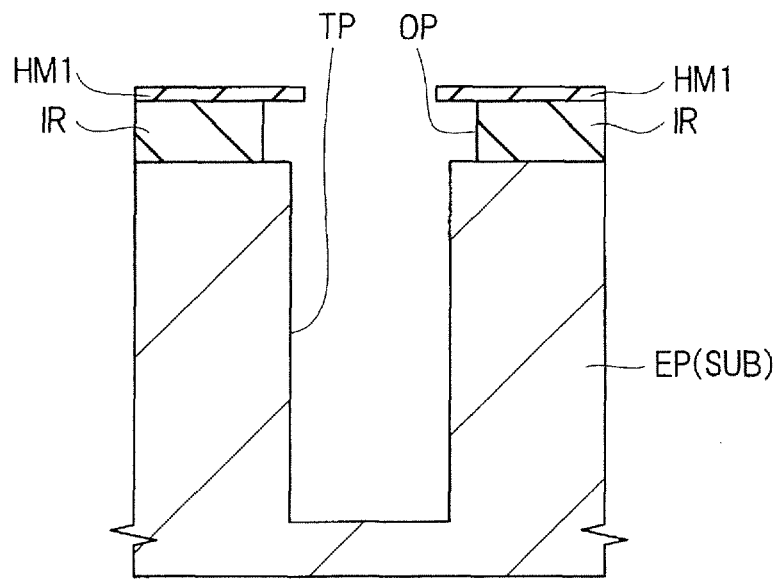
FIG. 35 is a fragmentary cross-sectional view of the semiconductor device according to Second Embodiment during a still further manufacturing step thereof.

In the present third modification example, after formation of a trench portion TP, wet etching, for example, with hydrofluoric acid (HF) is performed. By this wet etching, the insulating film HM2 made of a silicon oxide film is removed. In addition, a portion of the element isolation region IR made of a silicon oxide film exposed from the side surface of the opening portion OP is removed to retreat the side surface of the element isolation region IR from the side surface of the trench portion TP as shown in FIG. 35. This means that a portion of the side surface of the opening portion OP is retreated from the side surface of the trench portion TP. At this time, the end portion of the insulating film HM1 made of a silicon nitride film protrudes in the shape of eaves from the side surface of the element isolation region IR.

Figure 36:
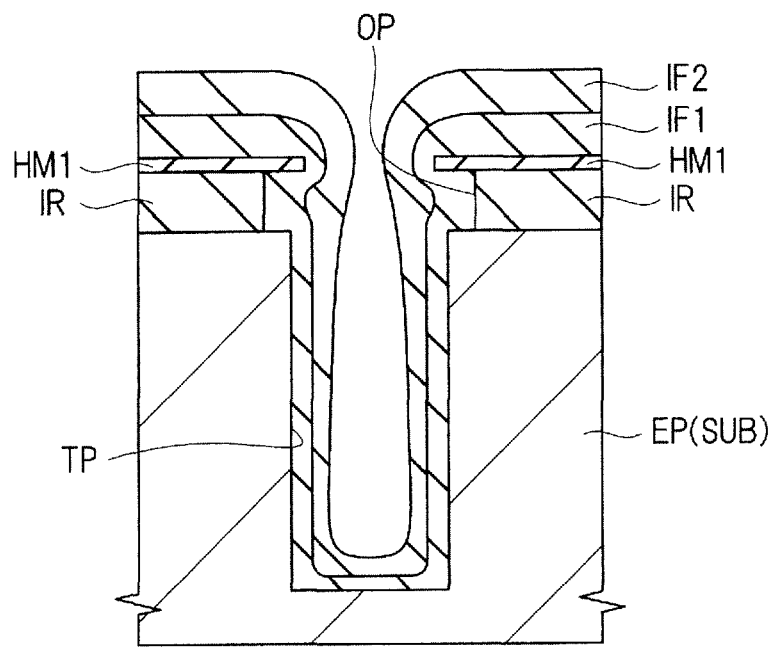
FIG. 36 is a fragmentary cross-sectional view of the semiconductor device according to Second Embodiment during a still further manufacturing step thereof.

In the present third modification example, steps similar to those (Step S173 and Step S174 in FIG. 6) described referring to FIGS. 18 and 20 in First Embodiment are performed. By these steps, as shown in FIG. 36, the side surface of the opening portion OP and the side surface of the trench portion TP are covered with the insulating film IF1 and the side surface of the opening portion OP and the side surface of the trench portion TP are covered with the insulating film IF2 via the insulating film IF1.

In the third modification example of Second Embodiment, however, since the end portion of the insulating film HM1 protrudes in the shape of eaves from the side surface of the element isolation region IR, the distance between the insulating films IF2 formed on both the side surfaces of the opening portion OP decreases.

Figure 37:
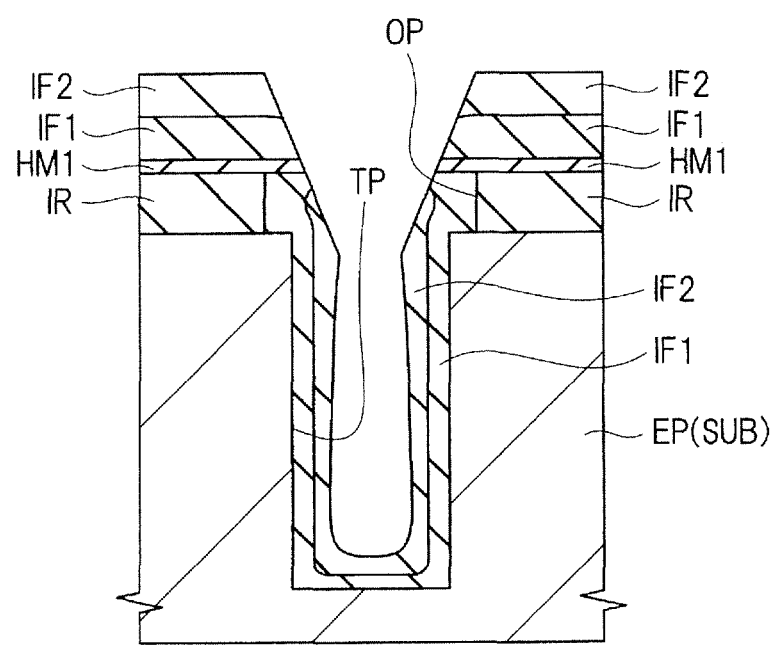
FIG. 37 is a fragmentary cross-sectional view of the semiconductor device according to Second Embodiment during a still further manufacturing step thereof.

Next, the insulting film IF2 covering therewith the side surface of the opening portion OP is etched with plasma. Preferably, etching is performed with high density plasma (HDP) higher in density than common plasma such as radio frequency plasma. As shown in FIG. 37, the insulating film IF2, the insulating film IF1, and the insulating film HM1 are etched in the vicinity of the opening end of the opening portion OP and this increases the distance between the insulating films IF2 formed on both the side surfaces of the opening portion OP.

Figure 38:
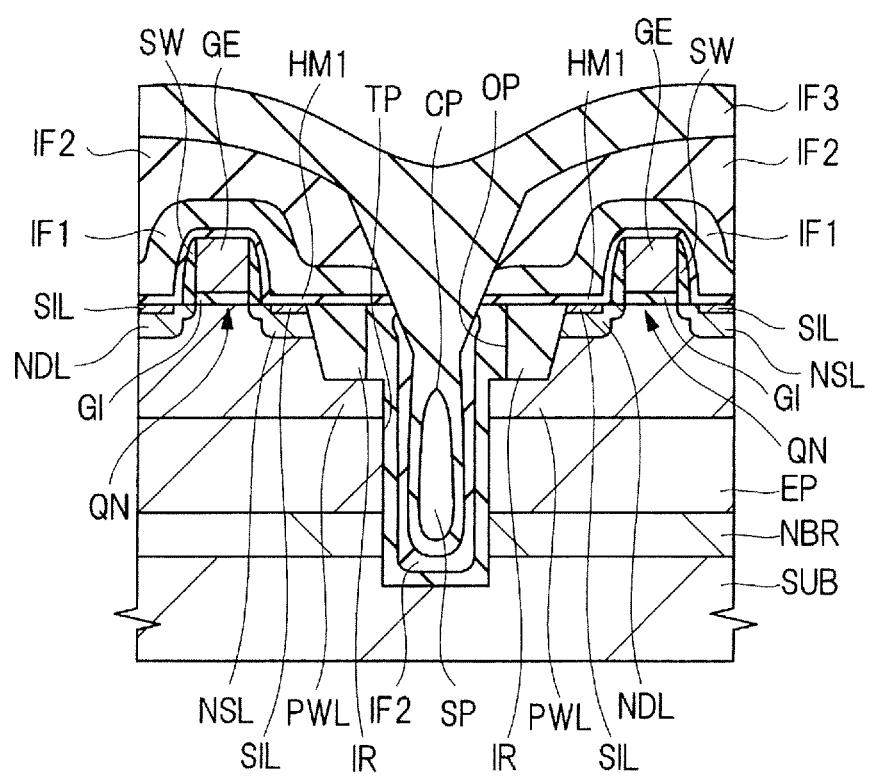
FIG. 38 is a fragmentary cross-sectional view of the semiconductor device according to Second Embodiment during a still further manufacturing step thereof.

Next, a step similar to that (Step S175 in FIG. 6) described referring to FIG. 21 in First Embodiment is performed to close the trench portion TP with the insulating film IF3 while leaving a space SP in the trench portion TP, as shown in FIG. 38.

The present third modification example facilitates lowering of the closing position CP of the space SP by etching with HDP to increase the distance between the insulating films IF2 formed on both the side surfaces of the opening portion OP.

Steps (Step S176 and Step S177 in FIG. 6 and Step S18 in FIG. 5) described referring to FIGS. 22, 4, and 23 in First Embodiment and steps subsequent thereto are performed to complete the manufacture of the semiconductor device of Second Embodiment.

<Major Characteristics and Advantages of the Present Embodiment>

The method of manufacturing a semiconductor device according to Second Embodiment has characteristics similar to those of the method of manufacturing a semiconductor device according to First Embodiment. The method of manufacturing a semiconductor device according to Second Embodiment has therefore advantages similar to those of the method of manufacturing a semiconductor device of First Embodiment.

In addition, in the method of manufacturing a semiconductor device according to Second Embodiment, after formation of the trench portion TP but prior to the formation of the insulating film IF1, at least a portion of the side surface of the opening portion OP is retreated from the side surface of the trench portion TP. This makes the width WDO of the opening portion OP greater than the width WDT of the trench portion TP. In other words, the width WDT of the trench portion TP becomes smaller than the width WDO of the opening portion OP. The closing position CP of the space SP is influenced by the trench portion TP having a width smaller than that of the opening portion OP. The closing position CP of the space SP can therefore be lowered definitely.

Thus, in Second Embodiment, compared with First Embodiment, the closing position CP of the space SP can be lowered to a desired position more easily. This therefore makes it possible to more surely prevent or suppress the surface height position of the insulating film IF3 from lowering to the closing position CP of the space SP upon planarizing the surface of the insulating film IF3, for example, by polishing the insulating film IF3. Further, this makes it possible to more surely prevent or suppress a slurry from penetrating through the space SP exposed from the surface of the insulating film IF3 and a washing liquid from penetrating through the space SP in a washing step conducted later.

It is therefore possible to more surely prevent or suppress the slurry or washing liquid that has penetrated through the space SP from bursting from the space SP and generating foreign matters and more surely prevent or suppress the semiconductor device from having defects in its shape. As a result, the semiconductor device can have improved performance more surely.

The invention made by the present inventors has been described based on some embodiments. It should however be borne in mind that the invention is not limited to or by these embodiments. It is needless to say that it can be changed in various ways without departing from the gist of the invention.

What is claimed is:

1. A method of manufacturing a semiconductor device, comprising the steps of:
   (a) forming a trench portion in a main surface of a semiconductor substrate;
   (b) forming a first insulating film having a silicon oxide film in the trench portion and over the main surface of the semiconductor substrate by chemical vapor deposition with a first gas containing an ozone gas and a tetraethoxysilane gas;
   (c) forming a second insulating film having a silicon oxide film over the first insulating film by plasma chemical vapor deposition; and
   (d) forming a third insulating film having a silicon oxide film over the second insulating film by chemical vapor deposition with a second gas containing an ozone gas and a tetraethoxysilane gas,
   wherein in the step (b), the first insulating film covers therewith a first side surface of the trench portion,
   wherein in the step (c), the second insulating film covers therewith the first side surface of the trench portion via the first insulating film, and
   wherein in the step (d), the third insulating film closes therewith the trench portion while leaving a space in the trench portion.

2. The method of manufacturing a semiconductor device according to claim 1, further comprising the step of:
   (e) forming a fourth insulating film having a silicon oxide film over the third insulating film by plasma chemical vapor deposition.

3. The method of manufacturing a semiconductor device according to claim 1, further comprising the steps of:
   (f) forming a fifth insulating film over the main surface of the semiconductor substrate; and
   (g) forming an opening portion penetrating through the fifth insulating film and reaching the semiconductor substrate,
   wherein in the step (a), the trench portion to be communicated with the opening portion is formed by etching the semiconductor substrate exposed from the opening portion,
   wherein in the step (b), the first insulating film covers therewith a second side surface of the opening portion,
   wherein in the step (c), the second insulating film covers therewith the second side surface of the opening portion via the first insulating film, and
   wherein the method of manufacturing the semiconductor device further comprises the step of:
   (h) after the step (a) but prior to the step (b), retreating the second side surface of the opening portion from the first side surface of the trench portion.

4. The method of manufacturing a semiconductor device according to claim 3, further comprising the step of:
   (i) forming a sixth insulating film having a silicon nitride film over the fifth insulating film,
   wherein in the step (f), the fifth insulating film has a silicon oxide film, and
   wherein in the step (g), the opening portion penetrating the sixth insulating film and the fifth insulating film and reaching the semiconductor substrate is formed.

5. The method of manufacturing a semiconductor device according to claim 4, further comprising the following step:
   (j) forming a seventh insulating film having a silicon oxide film over the sixth insulating film,
   wherein in the step (g), the opening portion penetrating through the seventh insulating film, the sixth insulating film, and the fifth insulating film and reaching the semiconductor substrate is formed, and
   wherein the step (h) comprises the steps of:
   (h1) etching a portion of the sixth insulating film exposed from the second side surface of the opening portion to retreat the sixth insulating film from the first side surface of the trench portion; and
   (h2) after the step (h1), the seventh insulating film is removed by etching and a portion of the fifth insulating film exposed from the second side surface of the opening portion is etched to retreat the fifth insulating film from the first side surface of the trench portion.

6. The method of manufacturing a semiconductor device according to claim 4, further comprising the step of:
(k) forming an eighth insulating film having a silicon oxide film over the sixth insulating film,
wherein in the step (g), the opening portion penetrates through the eighth insulating film, the sixth insulating film, and the fifth insulating film and reaching the semiconductor substrate, and
wherein the step (h) comprises the steps of:
(h3) etching the eighth insulating film to retreat the insulating film from the first side surface of the trench portion and etching a portion of the fifth insulating film exposed from the second side surface of the opening portion to retreat the fifth insulating film from the first side surface of the trench portion; and
(h4) after the step (h3), etching the sixth insulating film to retreat the insulating film from the first side surface of the trench portion.

7. The method of manufacturing a semiconductor device according to claim 3, comprising the steps of:
(l) forming a ninth insulating film having a silicon nitride film over the fifth insulating film; and
(m) forming a tenth insulating film having a silicon oxide film over the ninth insulating film,
wherein in the step (f), the fifth insulating film has a silicon oxide film,
wherein in the step (g), the opening portion penetrates through the tenth insulating film, the ninth insulating film, and the fifth insulating film and reaches the semiconductor substrate,
wherein in the step (h), the tenth insulating film is removed by etching and a portion of the fifth insulating film exposed from the second side surface of the opening portion is etched to retreat the fifth insulating film from the first side surface of the trench portion,
wherein the method of manufacturing a semiconductor device further comprises the step of:
(n) after the step (c) but prior to the step (d), etching the second insulating film covering therewith the second side surface of the opening portion with plasma.

8. The method of manufacturing a semiconductor device according to claim 1,
wherein in the step (c), the second insulating film is formed so as not to close the trench portion therewith.

9. The method of manufacturing a semiconductor device according to claim 1,
wherein in the step (c), the second insulating film is formed by plasma chemical vapor deposition using a third gas containing a tetraethoxysilane gas.

10. The method of manufacturing a semiconductor device according to claim 1,
wherein in the step (c), the second insulating film is formed by plasma chemical vapor deposition using a fourth gas containing a silane gas.

11. The method of manufacturing a semiconductor device according to claim 2,
wherein in the step (e), the fourth insulating film is formed by plasma chemical vapor deposition using a fifth gas containing a tetraethoxysilane gas.

12. The method of manufacturing a semiconductor device according to claim 2,
wherein in the step (e), the fourth insulating film is formed by plasma chemical vapor deposition using a sixth gas containing a silane gas.

13. The method of manufacturing a semiconductor device according to claim 1, comprising the step of:
(o) prior to the step (a), forming a semiconductor element over the main surface of the semiconductor substrate,
wherein in the step (b), the first insulating film covers therewith the semiconductor element.

14. The method of manufacturing a semiconductor device according to claim 13,
wherein in the step (a), the trench portion surrounds therewith the semiconductor element in plan view.

15. The method of manufacturing a semiconductor device according to claim 13,
wherein the semiconductor element is an LDMOSFET.

* * * * *